United States Patent
Hiroki et al.

[11] Patent Number: 5,298,739
[45] Date of Patent: Mar. 29, 1994

[54] PHOTODETECTOR CAPABLE OF SWEEPING OUT UNWANTED CARRIERS AND AN OPTICAL COMMUNICATION SYSTEM INCLUDING THE SAME

[75] Inventors: Tamayo Hiroki, Zama; Hidetoshi Nojiri, Hadano, both of Japan

[73] Assignee: Canon Kabushiki Kaisha, Tokyo, Japan

[21] Appl. No.: 886,922

[22] Filed: May 22, 1992

[30] Foreign Application Priority Data

May 24, 1991 [JP] Japan .................................. 4-149677
Apr. 24, 1992 [JP] Japan .................................. 3-140089

[51] Int. Cl.$^5$ .................. H01J 40/14; H01L 27/14
[52] U.S. Cl. .................. 250/227.11; 257/187; 257/290; 257/459
[58] Field of Search .................. 250/227.11; 359/195; 257/184, 187, 229, 257, 290, 459

[56] References Cited

U.S. PATENT DOCUMENTS

| | | | |
|---|---|---|---|
| 3,492,549 | 1/1970 | Janning | 257/290 |
| 3,993,963 | 11/1976 | Logan et al. | 257/184 |
| 4,553,317 | 11/1985 | Sakaki et al. | 29/572 |
| 4,794,609 | 12/1988 | Hana et al. | 372/50 |
| 4,879,470 | 11/1989 | Sugawa et al. | 257/290 |
| 4,990,990 | 2/1991 | Albrecht et al. | 257/290 |
| 5,027,177 | 6/1991 | Vasudev | 257/290 |
| 5,109,444 | 4/1992 | Habda et al. | 385/14 |

Primary Examiner—David C. Nelms
Assistant Examiner—Stephone B. Allen
Attorney, Agent, or Firm—Fitzpatrick, Cella, Harper & Scinto

[57] ABSTRACT

A light absorbing layer is formed in a photodetector that receives and detects light guided therein. Carriers are generated in the light absorbing layer in response to the guided light. Unwanted carriers likely to be generated in regions other than the light absorbing layer when light is guided into the photodetector are swept out by a carrier sweeping arrangement to improve the time response and light-current characteristics of the photodetector.

31 Claims, 14 Drawing Sheets

PHOTODETECTOR CAPABLE OF SWEEPING OUT UNWANTED CARRIERS AND AN OPTICAL COMMUNICATION SYSTEM INCLUDING THE SAME

BACKGROUND OF THE INVENTION

1. Field of the Invention

The present invention relates to photodetection and, more particularly a photodetector of a waveguide type, a surface incidence type or the like suitable for use in optical integration circuitry and an optical communication system including such a photodetector. The photodetector is arranged to sweep out unwanted carriers or holes and may be used to receive a signal or light in an optical communication or similar system.

2. Related Background Art

FIG. 1 shows a prior art waveguide type photodetector. In FIG. 1, an undoped GaAs buffer layer 402, an undoped $Al_xGa_{1-x}As$ first clad layer 403, an undoped $Al_yGa_{1-y}As$ waveguide layer 404 having a thickness of several $\mu m$ and a undoped $Al_xGa_{1-x}As$ second clad layer 405 are successively layered on a semi-insulating GaAs substrate 400. Further, an active or light absorbing layer 406 having a thickness of 0.2 $\mu m$ to 0.5 $\mu m$ is layered, and a source electrode 411, a gate electrode 412 and a drain electrode 413 are deposited thereon. This photodetector operates in a biased state, and a light to be detected is propagated through the waveguide 404. As a result, a photocurrent flows between the drain electrode 413 and the source electrode 411, and the light is detected.

In the prior art photodetector, however, carriers (electrons and holes) generated by a light absorbed in regions other than the absorbing layer 406 (i.e., the waveguide layer 404, the buffer layer 402, the clad layers 403 and 405, the substrate 400 and the like) are not swept out and are likely to be stored therein and extinguished after a certain time. The response characteristic of the photodetector is adversely affected by the unwanted stored carriers that flow into a light detecting portion thereof within that extinction time (a recombination time of carriers). Holes, especially, present a difficult problem because their mobility is much smaller than that of electrons. Further, an electrostatic potential is caused by the stored carriers, and a potential at the side of the substrate 400 fluctuates. As a result, the confinement of carriers in the absorbing layer 406 is lowered, and the light-current characteristic of the photodetector becomes unstable. Hence, the detection sensitivity is likely to degrade.

SUMMARY OF THE INVENTION

It is an object of the present invention to provide a photodetector including an arrangement for sweeping out unwanted carriers or holes to improve its time response characteristic and its light-current characteristic.

It is another object of the present invention to provide a photodetector not only including an arrangement for sweeping out unwanted carriers or holes to improve its time response characteristic and its light-current characteristic but also capable of solving a problem of carriers likely to be stored at a hetero-boundary at which the energy band gap is discontinuous and which extends perpendicularly to a direction of an electric field created by the application of a bias voltage for sweeping out the unwanted carriers that leads to a decrease of the response speed and the generation of an unnecessary electric field due to the unwanted stored carriers.

It is another object of the present invention to provide an optical communication system in which the above-mentioned photodetector is used for receiving a signal light.

The invention is directed to a photodetector in which a light is guided along a prescribed path. The guided light is absorbed to generate carriers which carriers are swept out of the photodetector.

According to one aspect of the present invention, the photodector includes light guide for guiding a light, a light detector which receives and detects the light guided by the guide and which includes a light absorbing layer for absorbing the light to generate carriers therein and a carrier-sweeping arrangement for sweeping out unwanted carriers generated in other regions than the light absorbing layer.

According to another aspect of the present invention, the carrier-sweeping arrangement of the photodetector mentioned above includes a conductive impurity layer formed in the vicinity of the light absorbing layer and an electrode formed on the conductive impurity layer.

According to yet another aspect the present invention, the photodetector mentioned above further includes at least two layers formed in the vicinity of the light absorbing layer and an energy band gap of materials of the at least two layers is continuously changed.

According to yet another aspect of the present invention, the optical communication system includes a plurality of nodes each having a receiver portion which includes the above-mentioned photodetector and a light transmission line for connecting the nodes.

These advantages and others will be more readily understood in connection with the following detailed description, claims and drawings.

DESCRIPTION OF THE PREFERRED EMBODIMENT

First Embodiment

Figure 1:
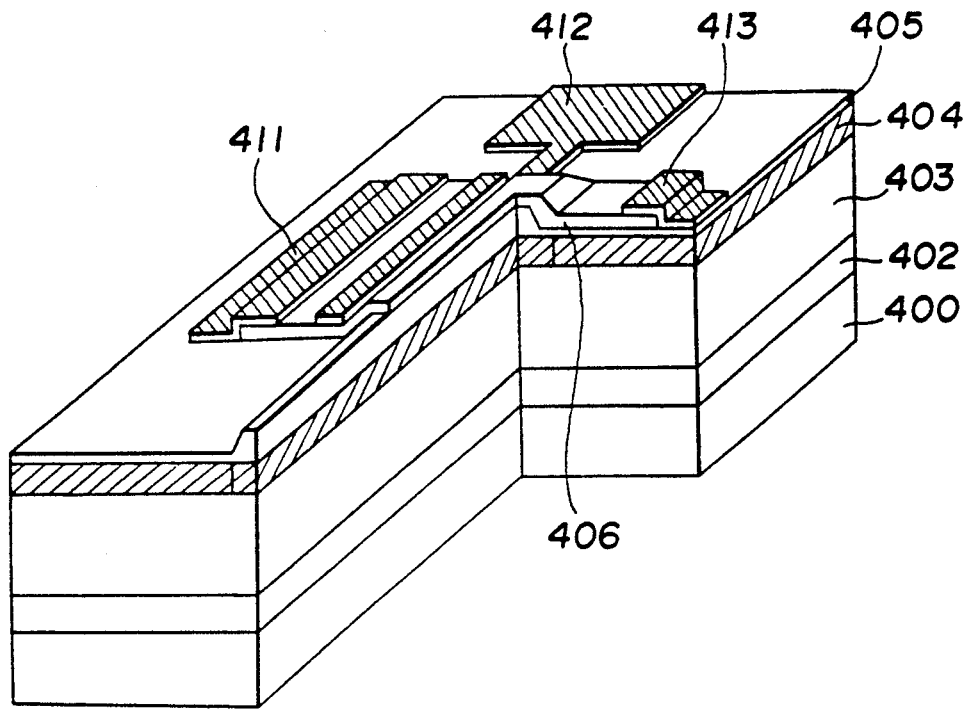
FIG. 1 is a perspective view of a prior art waveguide type photodetector.
Figure 2:
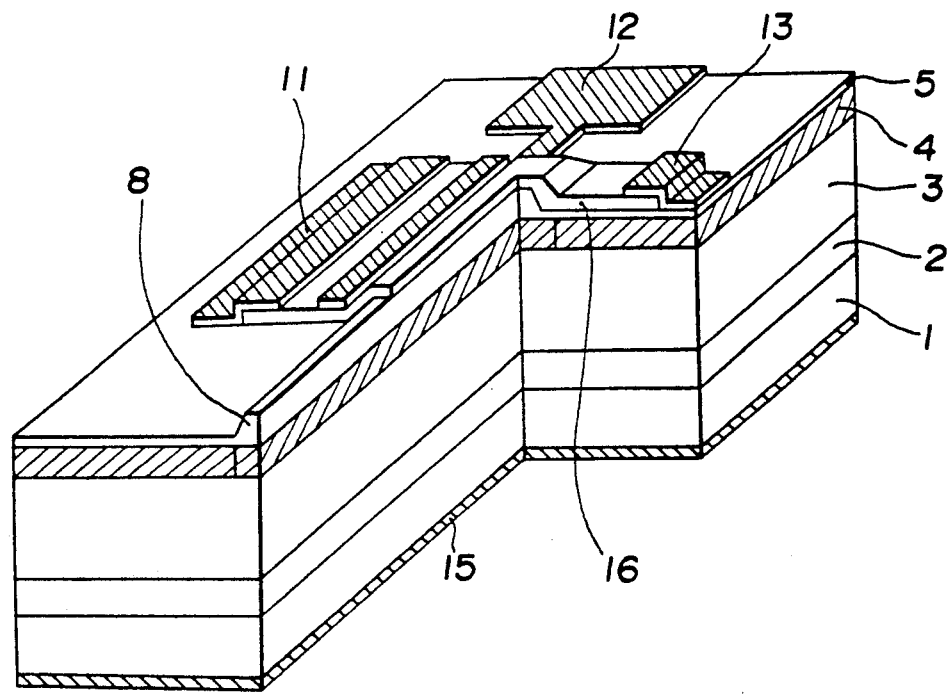
FIG. 2 is a perspective view of a first embodiment of a waveguide type photodetector according to the present invention.

FIG. 2 shows a first embodiment of a waveguide type photodetector according to the present invention in which a part thereof is cut away.

In FIG. 2, a buffer layer 2 of a p-GaAs layer having a thickness of 0.5 μm, a first clad layer 3 of a p-$Al_{0.5}Ga_{0.5}As$ layer having a thickness of 1.5 μm, a waveguide layer 4 of a superlattice layer having a thickness of 0.39 μm and consisting of alternately layered intrinsic (i− or φ−) $Al_{0.5}Ga_{0.5}As$ barrier layers (a thickness of 30 Å) and GaAs well layers (a thickness of 60 Å) and a second clad layer 5 of an i-$Al_{0.5}Ga_{0.5}As$ layer having a thickness of 0.3 μm are successively layered on a p-GaAs substrate 1.

The fabrication of a ridge type waveguide structure 8 for performing a confinement in a lateral direction is conducted in the following manner:

(1) A patterning of a waveguide is performed by conventional photolithography.

(2) The second clad layer 5 of i-$Al_{0.5}Ga_{0.5}As$ is etched to a depth of 0.28 μm by conventional reactive ion beam etching (RIBE) using a $Cl_2$ gas to form a waveguide 8.

(3) A resist mask is removed and a surface is thoroughly cleaned.

An active layer 6 of an n-GaAs layer having a thickness of 0.2 μm doped with Si of a concentration of $1.0 \times 10^{17}$ cm$^{-3}$ is then regrown on the thus fabricated three-dimensional waveguide 8. For those structures, molecular beam epitaxy (MBE) method, metal organic-chemical vapor deposition (MO-CVD) method and the like may be used as a crystal growth process.

A light receiving portion is then produced. Since the light receiving portion has a field effect transistor (FET) structure, source and drain electrodes 11 and 13 which function as ohmic electrodes for detecting carriers generated by absorbed light are formed with Au-Ge/Ni/Au and a gate electrode 12 is formed by an Al deposition. As to sizes of the device, the gate length is 4 μm, the gate width is 100 μm, the distance between the source 11 and the drain 13 is 1 μm and the distance between the gate 12 and the drain 13 is 4 μm. Further, an electrode 15 for sweeping out unwanted holes is formed by depositing Cr/Au on the bottom surface of the substrate 1 as shown in FIG. 2.

The device processing of the light receiving portion is performed in the following manner:

(1) The n-GaAs of the active layer 6 is selectively etched by photolithography. In a case of wet etching, the selective etching is conducted using an etchant of an ammonium solution (1 cc) and a $H_2O_2$ solution (200 cc), while in a case of dry etching only GaAs is selectively etched by a reactive ion etching (RIE) method using a $CCl_2F_2$ gas.

(2) The wafer is heated, and silicon oxide is deposited by a sputtering deposition system.

(3) Other portions than the active layer 6 are covered with a resist by photolithography, and the etching is conducted using a buffered HF solution (BHF).

(4) A silicon nitride is deposited by the CVD method in order to protect a surface of the active layer 6 and a surface of the φ-AlGaAs in portions other than the waveguide 8.

(5) A patterning of the source and drain electrodes 11 and 13 is performed.

(6) The silicon nitride of the source and drain electrodes 11 and 13 is etched by the RIE method using a $CF_4$ gas.

(7) The Au-Ge/Ni/Au is continuously deposited.

(8) The Au-Ge/Ni/Au in portions other than the electrode portions 11 and 13 is removed by heating an AZ remover and peeling the resist.

(9) An alloying is performed to obtain an ohmic contact between the active layer 6 and the electrodes 11 and 13.

(10) A patterning of the gate electrode 12 is conducted.

(11) The silicon nitride on the gate electrode portion 12 is etched by the RIE method using a $CF_4$ gas.

(12) A material of Al of the gate electrode 12 is deposited.

(13) The Al in portions other than the gate electrode portion 12 is removed by heating an AZ remover and peeling the resist.

(14) The p-type substrate 1 is mechanically lapped to reduce the thickness of the entire device to 100 μm to 150 μm.

(15) The Cr/Au is continuously deposited on the bottom surface of the substrate 1. This step is readily performed since no patterning is needed.

(16) An alloying is performed to obtain an ohmic contact between the substrate 1 and the electrode 15.

(17) The device is fixed to a package substrate to establish contact with its exterior.

Figure 3:
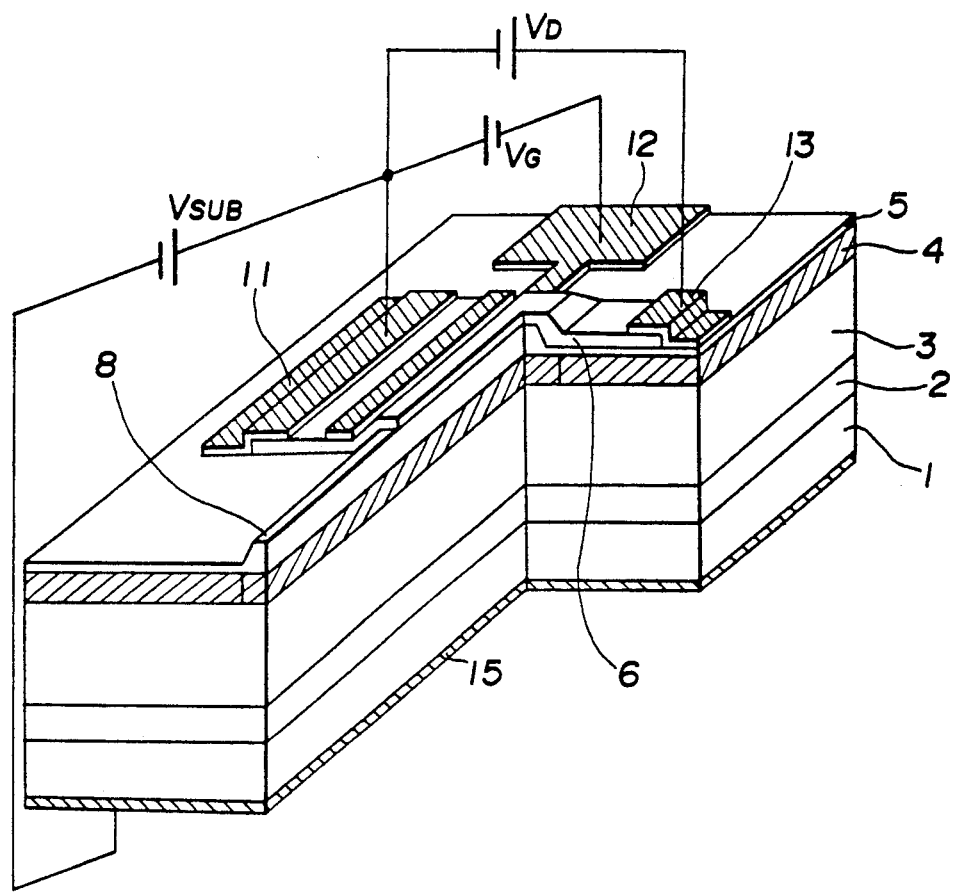
FIG. 3 is a view illustrating a method of applying a bias voltage in the first embodiment.

The operation of the thus fabricated device will be described referring to FIG. 3. As shown in FIG. 3, a positive voltage $V_D$ relative to the source electrode 11 is applied to the drain electrode 13, and a negative voltage $V_G$ relative to the source electrode 11 is applied to the gate electrode 12. Since the gate electrode 12 is a Schottky electrode, the application of a reverse bias voltage thereto causes a depletion layer in the active layer 6. The width of the depletion layer varies depending on the gate voltage $V_G$, and the width of a channel is changed accordingly. As a result, a drain current $I_D$ flowing between the drain electrode 13 and the source electrode 11 is varied.

When the depletion layer reaches the second clad layer 5, the channel is closed and the drain current $I_D$ ceases to flow. In this pinch-off state, when a light having a wavelength of 830 nm from a semiconductor laser is propagated through the waveguide 8 below the active layer 6, the light is propagated while being effectively absorbed into the active layer 6 with a little reflection owing to the existence of the second clad layer 5 (i.e., the matching of a refractive index is established by the second clad layer 5). Thus, carriers are generated in the active layer 6.

Electrons generated in the depletion layer and between the gate 12 and the drain 13 reach the drain electrode 13 due to an electric field therebetween, and are detected thereat. Holes are attracted to the depletion layer and, as a result, the depletion layer is contracted. If no light is applied, the depletion layer is pinched off and hence no current flows. When the light is applied, the depletion layer contracts as mentioned above and a current flows. Here, the depletion layer is changed depending on the magnitude of the applied light, and a current according to the applied light magnitude flows between the source electrode 11 and the drain electrode 13. Thus, the amount of the applied light is detected.

On the other hand, hole carriers generated by a light absorbed in regions (the clad layers 3 and 5, the buffer layer 2, the waveguide layer 4 and the substrate 1) other than the light absorbing layer 6 are diffused and stored thereat since the mobility thereof is much smaller than that of the electron by more than one order and almost no electric field exists in those other regions. As a result, the time response characteristic of the device is degraded. Further, holes are likely to move to those other regions since the depth of wells of a band structure in the valence band of the superlattice layer 4 is relatively small. Moreover, the stored holes cause an unwanted electric field since the hole has a positive charge. Due to this electric field, the confinement of carriers in the active layer 6 is degraded. Accordingly, the light-current characteristic is rendered unstable and hence the sensitivity of the photodetector is lowered.

In this embodiment, however, the conductivity type of the substrate 1 is made p-type, the electrode 15 is formed on the substrate 1 and a bias voltage $V_{SUB}$ is applied as shown in FIG. 3. Unwanted holes generated in the regions other than the active layer 6 are thus swept out through the substrate 1. Therefore, the time response characteristic is improved. Further, electrostatic potentials of respective portions in the photodetector are made stable since the electric field due to the unwanted holes ceases. Thus, the light-current characteristic becomes stable and the sensitivity is improved in this embodiment.

Second Embodiment

Figure 4:
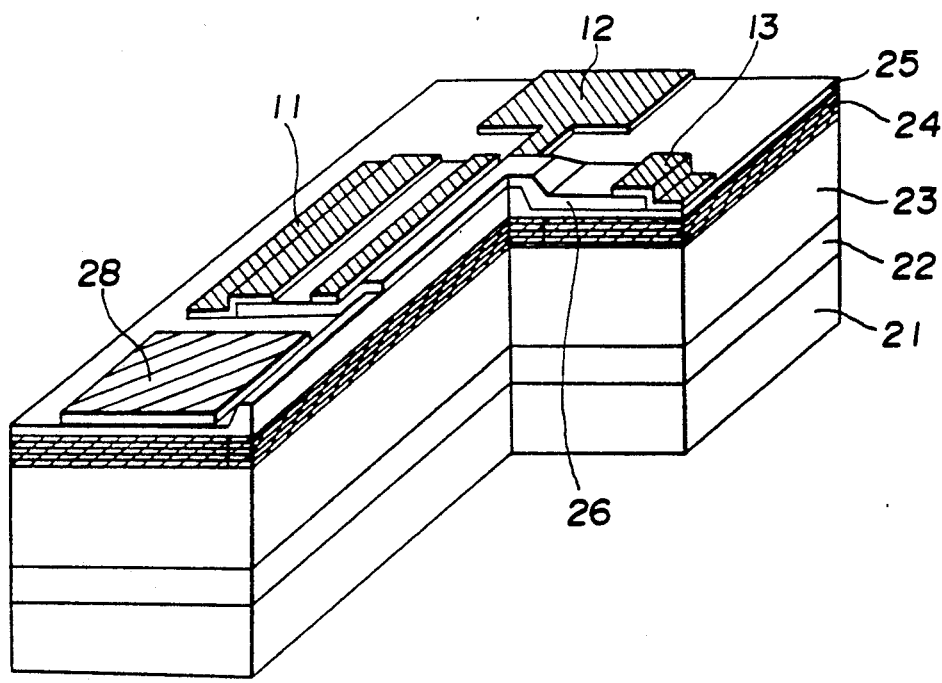
FIG. 4 is a perspective view of a second embodiment of a waveguide type photodetector according to the present invention.

FIG. 4 shows a second embodiment of a waveguide type photodetector according to the present invention in which a part thereof is cut away.

In FIG. 4, a buffer layer 22 of a $\phi$-GaAs layer having a thickness of 0.5 $\mu$m, a first clad layer 23 of a $\phi$-Al$_{0.5}$Ga$_{0.5}$As layer having a thickness of 1.5 $\mu$m, a waveguide layer 24 of a superlattice layer having a thickness of 0.39 $\mu$m and consisting of alternately layered $\phi$-Al$_{0.5}$As barrier layers (a thickness of 30 Å) and $\phi$-GaAs well layers (a thickness of 60 Å) and a second clad layer 25 of a p-Al$_{0.5}$Ga$_{0.5}$As layer having a thickness of 0.3 $\mu$m are successively layered on a semi-insulating GaAs substrate 21.

A ridge-type waveguide is then fabricated similar to the first embodiment. After that, an active or light absorbing layer 26 of an n-GaAs layer having a thickness of 0.2 $\mu$m and doped with Si of a concentration of $1.0 \times 10^{17}$cm$^{-3}$ is regrown on the thus fabricated three-dimensional waveguide, and the source, gate and drain electrodes 11, 12 and 13 are formed similarly to the first embodiment. Further, an electrode 28 for sweeping out unwanted holes is formed in a region on the second clad layer 25 adjacent to the ridge-type waveguide.

Figure 5:
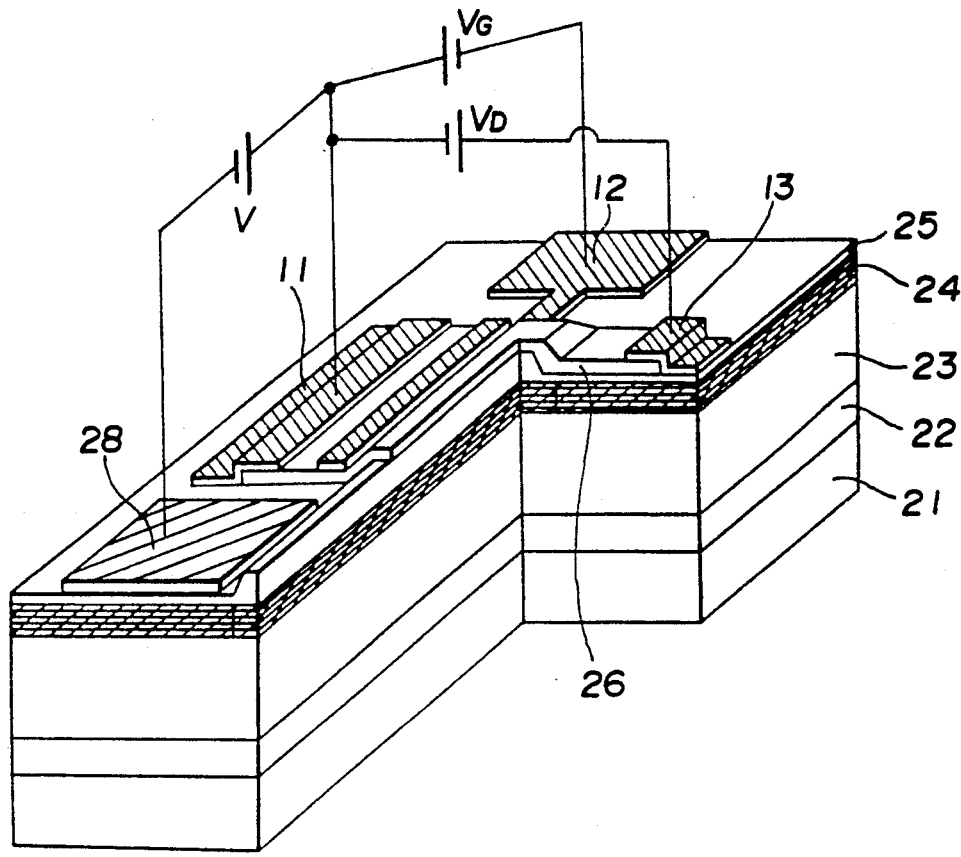
FIG. 5 is a view illustrating a method of applying a bias voltage in the second embodiment.

Also in the second embodiment, similar to the first embodiment, a positive voltage $V_D$ relative to the source electrode 11 is applied to the drain electrode 13, and a negative voltage $V_G$ relative to the source electrode 11 is applied to the gate electrode 12, as shown in FIG. 5. The pinch-off state is thus established. In this state, when a light having a wavelength of 830 nm from a semiconductor laser is propagated through the waveguide below the active layer 26, the light is propagated while being effectively absorbed into the active layer 26. Thus, carriers are generated in the active layer 26, and the light is detected similarly to the first embodiment.

In the second embodiment, the conductivity type of the second clad layer 25 is made p-type, and the hole-sweeping electrode 28 formed on this layer 25 functions as a hole-sweeping layer to effectively sweep out unwanted holes generated in the regions other than the active layer 26. The hole-sweeping electrode 28 is preferably formed on the second clad layer 25 through a p$^+$-GaAs layer formed thereon. In the second embodiment, unwanted holes generated especially in the waveguide and thereabout can be effectively swept out at high speed. Accordingly, the time response characteristic and the light-current characteristic are further improved.

Third Embodiment

Figure 6:
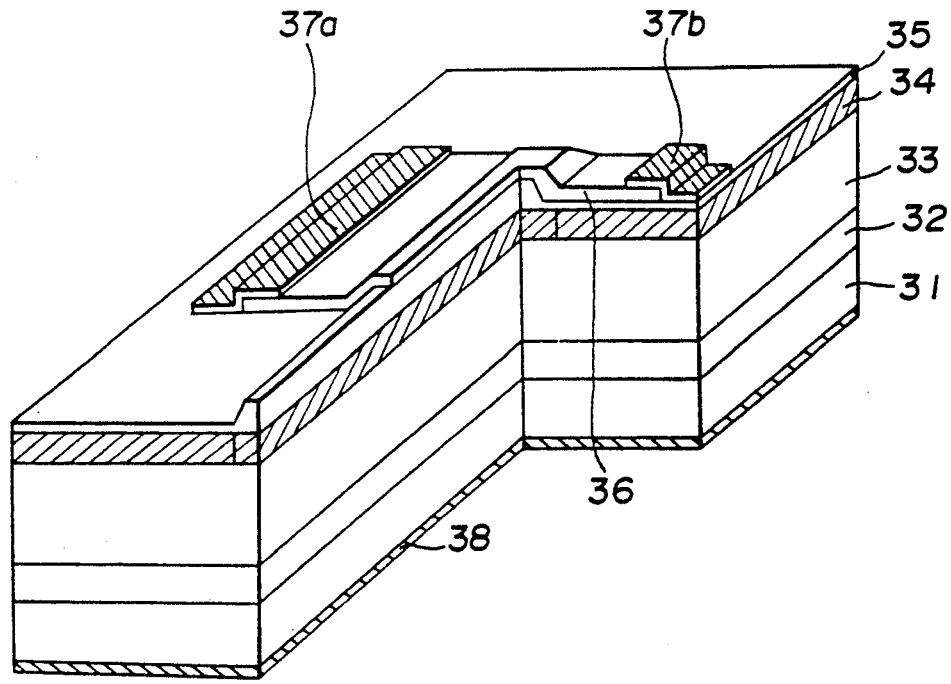
FIG. 6 is a perspective view of a third embodiment of a waveguide type photodetector according to the present invention.

FIG. 6 shows a third embodiment of a waveguide type photodetector according to the present invention in which a part thereof is cut away.

In FIG. 6, a buffer layer 32 of a p-GaAs layer having a thickness of 0.5 $\mu$m, a first clad layer 33 of a p-Al$_{0.5}$Ga$_{0.5}$As layer having a thickness of 1.5 $\mu$m, a waveguide layer 34 of a superlattice layer having a thickness of 0.39 $\mu$m and consisting of alternately layered $\phi$-Al$_{0.5}$Ga$_{0.5}$As barrier layers (a thickness of 30 Å)

and φ-GaAs well layers (a thickness of 60 Å) and a second clad layer 35 of a φ-Al$_{0.5}$Ga$_{0.5}$As layer having a thickness of 0.3 μm are successively layered on a p$^+$-GaAs substrate 31. A ridge-type waveguide is then fabricated by etching the second clad layer 35 to a depth of 0.28 μm. After that, an active or light absorbing layer 36 of a φ-GaAs layer having a thickness of 0.2 μm is regrown on the thus fabricated three-dimensional waveguide. For those structures, the MBE method, MO-CVD method and the like may be used as a crystal growth process.

The active layer 36 is then selectively etched by photolithography, and Ti/Pt/Au is deposited to form two Schottky electrodes 37a and 37b. A metal semiconductor metal (MSM) detector is thus fabricated. Those electrodes 37a and 37b are made parallel to the length of the waveguide. Further, Cr/Au is deposited on the bottom surface of the substrate 31 as shown in FIG. 6 to form an electrode 38 for sweeping out unwanted holes.

Figure 7:
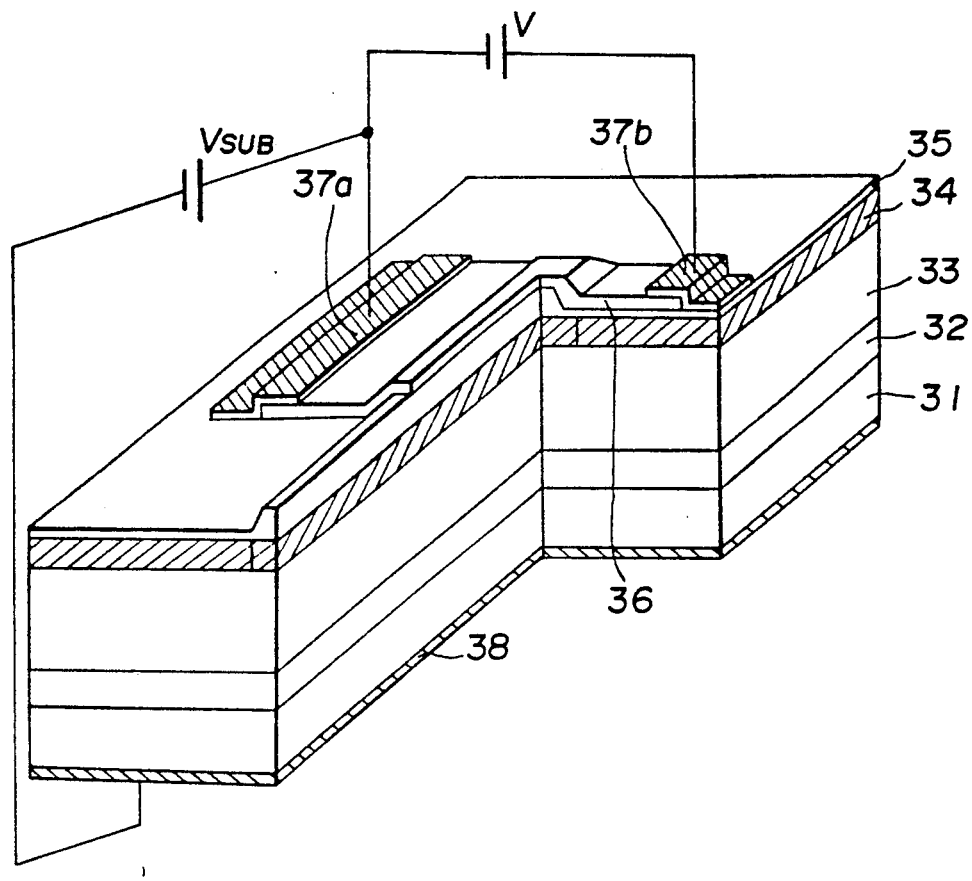
FIG. 7 is a view illustrating a method of applying a bias voltage in the third embodiment.

The operation of the thus fabricated device will be described. As shown in FIG. 7, a bias voltage V is applied between the two electrodes 37a and 37b to create a substantially uniform electric field between the two electrodes 37a and 37b and hence obtain a depletion area therebetween. In this state, when a light having a wavelength of 830 nm from a semiconductor laser is propagated through the waveguide below the active layer 36, the light is propagated while being effectively absorbed into the active layer 36. Thus, carriers are generated in the active layer 36, and they drift towards the electrodes 37a and 37b to be detected as a photocurrent. On the other hand, hole carriers generated by the light absorbed in regions other than the active layer 36 (the clad layers 33 and 35, the buffer layer 32, the waveguide layer 34 and the substrate 31) are likely to adversely affect the time response characteristic and the light-current characteristic of the device, as explained in the first embodiment.

In this embodiment, the conductivity type of the substrate 31 side is made p-type similar to the first embodiment, and the electrode 38 is formed on the substrate 31. Unwanted holes generated in the regions other than the active layer 36 can be swept out through the substrate 31 by applying a bias voltage $V_{SUB}$ as shown in FIG. 7. Thus, the time response characteristic is improved similarly to the first embodiment. Further, since no electric field is caused by the unwanted holes, electrostatic potentials in respective portions of the photodetector become stable. As a result, the light-current characteristic is stabilized and the sensitivity is enhanced.

Fourth Embodiment

Figure 8:
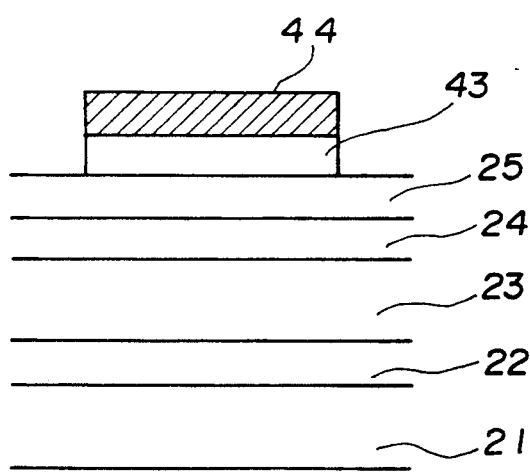
FIG. 8 is a cross-sectional view of a fourth embodiment of a waveguide type photodetector according to the present invention.

FIG. 8 shows a fourth embodiment of the present invention.

In FIG. 8, a buffer layer 22 of a φ-GaAs layer having a thickness of 0.5 μm, a first clad layer 23 of a φ-Al$_{0.5}$Ga$_{0.5}$As layer having a thickness of 1.5 μm, a waveguide layer 24 of a superlattice layer having a thickness of 0.39 μm and consisting of alternately layered φ-Al$_{0.5}$Ga$_{0.5}$As barrier layers (a thickness of 30 Å) and φ-GaAs well layers (a thickness of 60 Å) and a second clad layer 25 of a p-Al$_{0.5}$Ga$_{0.5}$As layer having a thickness of 0.3 μm are successively layered on a semi-insulating GaAs substrate 21, similarly to the second embodiment shown in FIG. 4. A ridge-type waveguide is then fabricated by etching the second clad layer 25 similarly to the first embodiment, and at the same time a p$^+$-GaAs contact layer 43 for a carrier-sweeping electrode 44 is formed as shown in FIG. 8. Succeeding processes are the same as those of the second embodiment. FIG. 8 is a cross-sectional view at the carrier-sweeping electrode 44.

In this embodiment, since the contact layer 43 for the carrier-sweeping electrode 44 is formed for enhancing an ohmic contact between the electrode 44 and the second clad layer 25, the unwanted carriers can be effectively swept out at high speed. The characteristics of the second embodiment are further improved in this embodiment.

Fifth Embodiment

Figure 9:
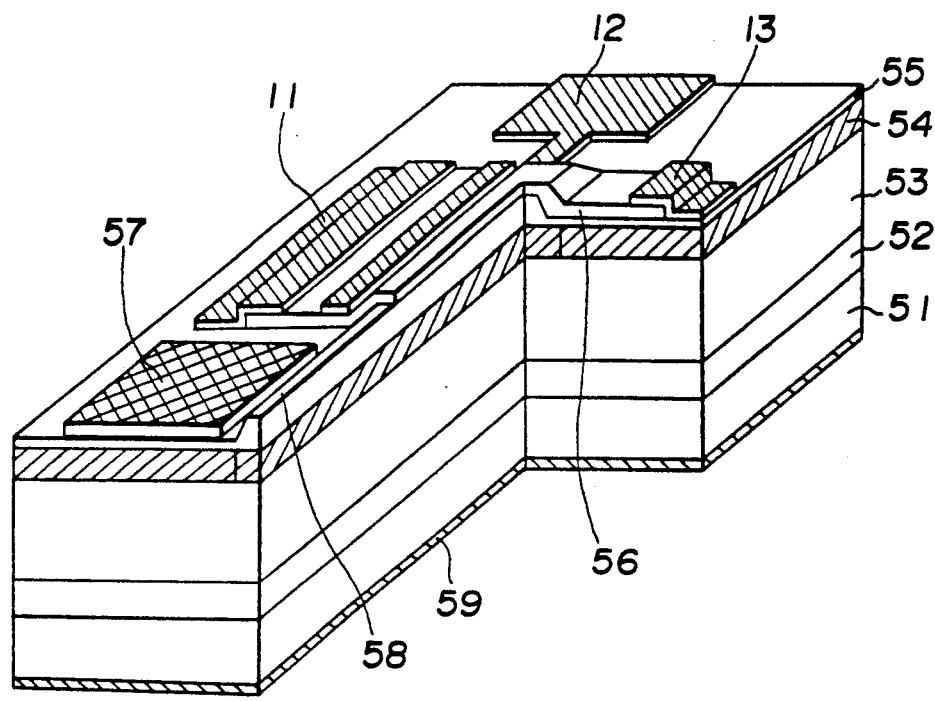
FIG. 9 is a perspective view of a fifth embodiment of a waveguide type photodetector according to the present invention.

FIG. 9 shows a fifth embodiment of a waveguide type photodetector according to the present invention in which a part thereof is cut away.

In FIG. 9, a buffer layer 52 of an n-GaAs layer having a thickness of 0.5 μm, a first clad layer 53 of an n-Al$_{0.5}$Ga$_{0.5}$As layer having a thickness of 1.5 μm, a waveguide layer 54 of a superlattice layer having a thickness of 0.39 μm and consisting of alternately layered φ-Al$_{0.5}$Ga$_{0.5}$As barrier layers (a thickness of 30 Å) and φ-GaAs well layers (a thickness of 60 Å) and a second clad layer 55 of a p-Al$_{0.5}$Ga$_{0.5}$As layer having a thickness of 0.3 μm are successively layered on an n$^+$-GaAs substrate 51. The waveguide layer 54 may be a layer of AlGaAs whose Al mole fraction is larger than that of the clad layers 53 and 55 or a layer in which the Al mole fraction is varied so that its refractive index gradually increases towards its center in a layer thickness direction or the like, not limited to the superlattice layer.

The fabrication of a ridge type waveguide structure 58 for performing a confinement in a lateral direction is conducted similar to the first embodiment in the following manner:
  (1) A patterning of the waveguide 58 is performed by conventional photolithography.
  (2) The second clad layer 55 of p-Al$_{0.5}$Ga$_{0.5}$As is etched to a depth of 0.28 μm by the RIBE using a Cl$_2$ gas to form the waveguide 58.
  (3) A resist mask is removed and a surface is thoroughly cleaned.

An active layer 56 of an n-GaAs layer having a thickness of 0.2 μm and doped with Si of a concentration of $1.0 \times 10^{17}$ cm$^{-3}$ is then regrown the thus fabricated three-dimensional waveguide. For those structures, the MBE method, MO-CVD method and the like may be used as a crystal growth process.

A light receiving portion is then produced. Since the light receiving portion has an FET structure, source and drain electrodes 11 and 13 which function as an ohmic electrode for detecting carriers generated by the absorbed light are formed with Au-Ge/Ni/Au and a gate electrode 12 is formed by an Al deposition. As to sizes of the device, the gate length is 4 μm, the gate width is 100 μm, the distance between the source 11 and the drain 13 is 1 μm and the distance between the gate 12 and the drain 13 is 4 μm. Further, an electrode 57 for sweeping out unwanted carriers is formed by depositing Cr/Au in a region on the second clad layer 55 of p-AlGaAs adjacent to the ridge waveguide 58 as shown in FIG. 9.

The device processing of the light receiving portion is performed in the following manner:
  (1) The n-GaAs of the active layer 56 is selectively etched by photolithography. In a case of wet etching, the selective etching is conducted using an etchant of an ammonium solution (1 cc) and a H$_2$O$_2$ solution (200 cc), while in a case of dry etching only GaAs is selectively etched by the RIE method using a CCl$_2$F$_2$ gas.

(2) The wafer is heated, and silicon oxide is deposited by a sputtering deposition system.

(3) Portions other than the active layer 56 are covered with a resist by the photolithography, and the etching is conducted using a buffered HF solution (BHF).

(4) Silicon nitride is deposited by the CVD method in order to protect a surface of the active layer 56 and a surface of the $\phi$-AlGaAs in portions other than the waveguide 58.

(5) A patterning of the source and drain electrodes 11 and 13 is performed.

(6) The silicon nitride of the source and drain electrodes 11 and 13 is etched by the RIE method using a CF$_4$ gas.

(7) The Au-Ge/Ni/Au is continuously deposited.

(8) The Au-Ge/Ni/Au in portions other than the electrode portions 11 and 13 is removed by heating an AZ remover and peeling the resist.

(9) A patterning of the carrier-sweeping electrode 57 is performed.

(10) The silicon nitride of the carrier-sweeping electrode portion 57 is etched by the RIE method using a CF$_4$ gas.

(11) The Cr/Au is deposited.

(12) An alloying is performed to establish an ohmic contact of the electrodes 11 and 13.

(13) A patterning of the gate electrode 12 is conducted.

(14) The silicon nitride on the gate electrode portion 12 is etched by the RIE method using a CF$_4$ gas.

(15) A material of Al of the gate electrode 12 is deposited by conventional electron beam (EB) method.

(16) The Al in portions other than the gate electrode portion 12 is removed by heating an AZ remover and peeling the resist.

(17) The n$^+$-type substrate 51 is mechanically lapped to reduce the thickness of the entire device to 100 $\mu$m to 150 $\mu$m.

(18) The Au-Ge/Ni/Au is continuously deposited.

(19) An alloying is performed for improving a contact between the substrate 51 and the electrode 59.

(20) The device is fixed to a package substrate to establish a contact with the exterior.

Figure 10:
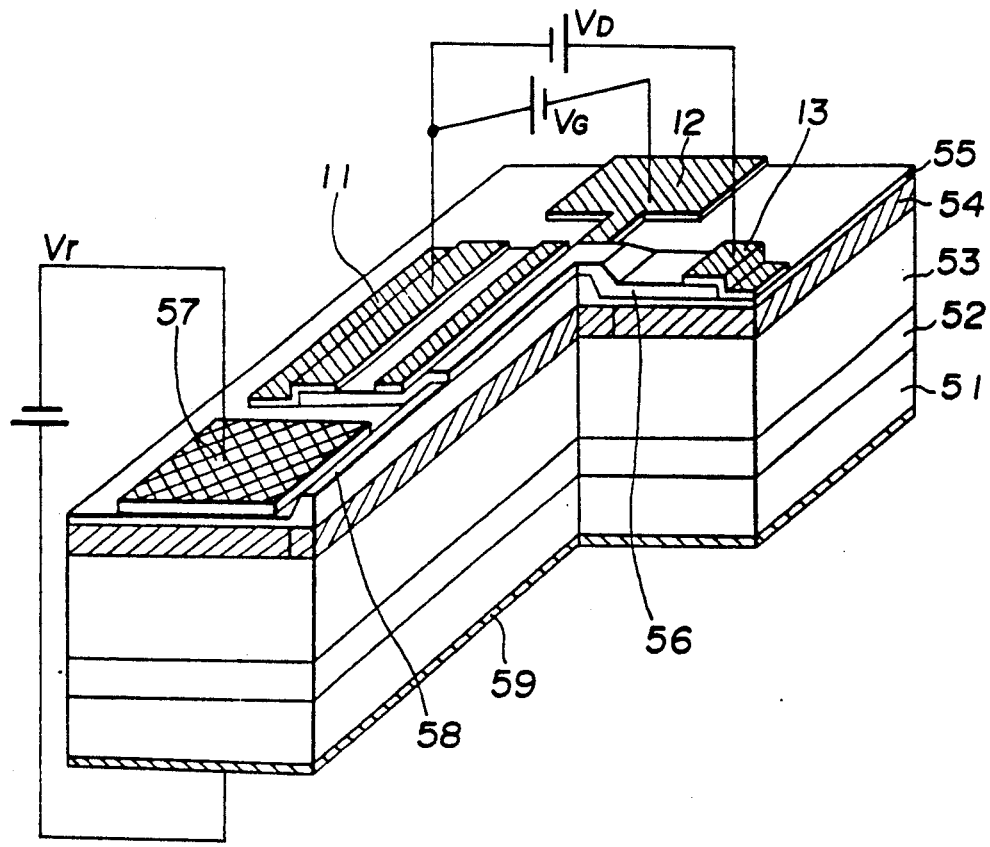
FIG. 10 is a view illustrating a method of applying a bias voltage in the fifth embodiment.

The operation of the thus fabricated device will be described referring to FIG. 10. As shown in FIG. 10, a positive voltage V$_D$ relative to the source electrode 11 is applied to the drain electrode 13, and a negative voltage V$_G$ relative to the source electrode 11 is applied to the gate electrode 12. Since the gate electrode 12 is a Schottky electrode, the application of a reverse bias voltage thereto causes a depletion layer in the active layer 56. The width of the depletion layer varies depending on the gate voltage V$_G$, and the width of a channel is changed accordingly. As a result, a drain current I$_D$ flowing between the drain electrode 13 and the source electrode 11 is varied.

When the depletion layer reaches the second clad layer 55, the channel is closed and the drain current I$_D$ ceases to flow. In this pinch-off state, when a light having a wavelength of 830 nm from a semiconductor laser is propagated through the waveguide 58 below the active layer 56, the light is propagated while being effectively absorbed into the active layer 56 with little reflection owing to the existence of the second clad layer 55. Thus, carriers are generated in the active layer 56.

Electrons generated in the depletion layer and between the gate 12 and the drain 13 reach the drain electrode 13 due to the electric field and are detected thereat. Holes are attracted to the depletion layer, and as a result the depletion layer contracts. If no light is applied, the depletion layer is pinched off and hence no current flows. When the light is applied, the depletion layer contracts as mentioned above and a current flows. Here, the depletion layer changes depending on the magnitude of the applied light, and a current according to the magnitude of the applied light flows between the source electrode 11 and the drain electrode 13. Thus, the amount of the applied light is detected.

On the other hand, carriers generated by a light absorbed in regions (the clad layers 53 and 55, the buffer layer 52, the waveguide layer 54 and the substrate 51) other than the light absorbing layer 56 are likely to be stored since almost no electric field exists in those other regions. As a result, the time response characteristic of the device is likely to degrade.

In this embodiment, the second clad 55 is caused to function as the carrier-sweeping layer, the electrodes 57 and 59 are formed on the second clad layer 55 and the substrate 51 and a reverse bias voltage is applied as shown in FIG. 10. Unwanted carriers generated in the regions other than the active layer 56 are thus swept out. Therefore, the time response characteristic is improved. Further, the light-current characteristic becomes stable because the confinement of carriers in the active layer 56 is improved.

Sixth Embodiment

Figure 11:
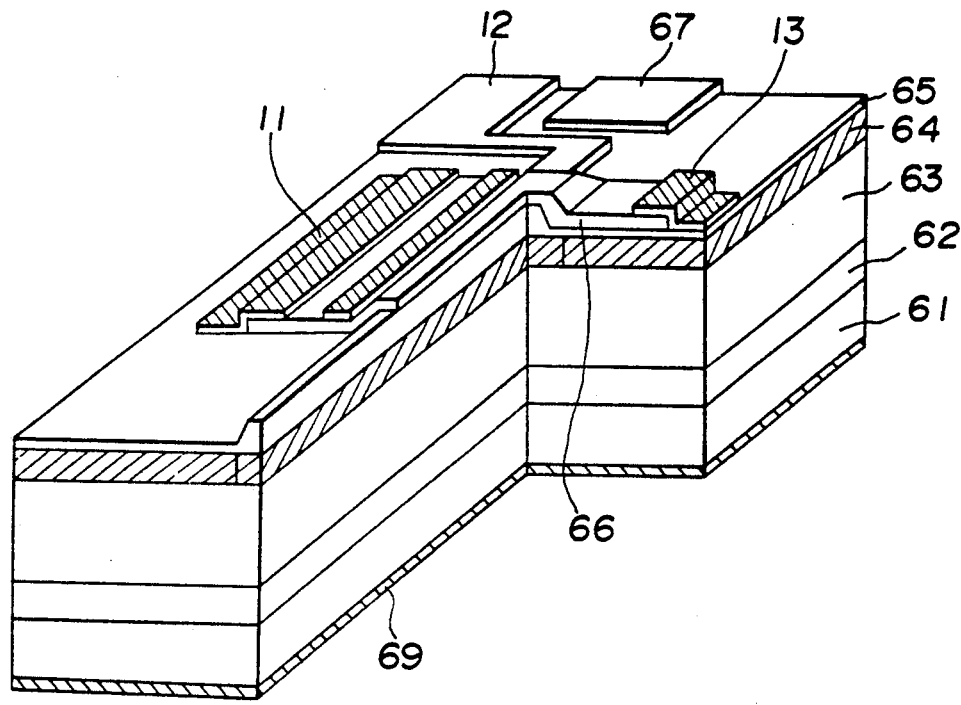
FIG. 11 is a perspective view of a sixth embodiment of a waveguide type photodetector according to the present invention.

FIG. 11 shows a sixth embodiment of a waveguide type photodetector according to the present invention in which a part thereof is cut away.

In FIG. 11, a buffer layer 62 of an n-GaAs layer having a thickness of 0.5 $\mu$m, a first clad layer 63 of an n-Al$_{0.5}$Ga$_{0.5}$As layer having a thickness of 1.5 $\mu$m, a waveguide layer 64 of a superlattice layer having a thickness of 0.39 $\mu$m and consisting of alternately layered $\chi$-Al$_{0.5}$Ga$_{0.5}$As barrier layers (a thickness of 30 Å) and $\chi$-GaAs well layers (a thickness of 60 Å) and a second clad layer 65 of a p-Al$_{0.5}$Ga$_{0.5}$As layer having a thickness of 0.3 $\mu$m are successively layered on an n$^+$-GaAs substrate 61.

A ridge-type waveguide is then fabricated similar to the fifth embodiment. After that, an active or light absorbing layer 66 of an n-GaAs layer having a thickness of 0.2 $\mu$m and doped with Si of a concentration of $1.0 \times 10^{17}$cm$^{-3}$ is regrown on thus fabricated three-dimensional waveguide, and the source, gate and drain electrodes 11, 12 and 13 are formed similarly to the fifth embodiment. Further, an electrode 67 for sweeping out unwanted carriers is formed in a region on the second clad layer 65 of p-AlGaAs and on an extended line of the ridge-type waveguide in a light propagation direction, and a substrate electrode 69 is formed on the bottom surface of the substrate 61, as shown in FIG. 11.

Also in the sixth embodiment, similar to the fifth embodiment, a positive voltage V$_D$ relative to the source electrode 11 is applied to the drain electrode 13, and a negative voltage V$_G$ relative to the source electrode 11 is applied to the gate electrode 12. The pinch-off state is thus established. In this state, when a light having a wavelength of 830 nm from a semiconductor laser is propagated through the waveguide below the active layer 66, the light is propagated while being effectively absorbed into the active layer 66. Thus, carriers are generated in the active layer 66, and the light is detected similarly to the fifth embodiment.

On the other hand, unwanted carriers are generated by a light not completely absorbed in a region of the active layer 66, in regions (the clad layers 63 and 65, the buffer layer 62 and the substrate 61) other than the light absorbing layer 66. Those carriers are likely to degrade the response characteristic and cause an unwanted electric field.

In this embodiment, the electrode 67 is formed on the extended line of the waveguide while the second clad layer 65 functions as the carrier-sweeping layer, and a voltage is applied between the second clad layer 65 and the substrate 61. Thus, the unwanted carriers generated by the light not absorbed in the active layer 66 can be swept out. Therefore, the time response characteristic is improved. Further, the light-current characteristic is rendered stable since the confinement of carriers in the active layer 66 is improved.

Seventh Embodiment

Figure 12:
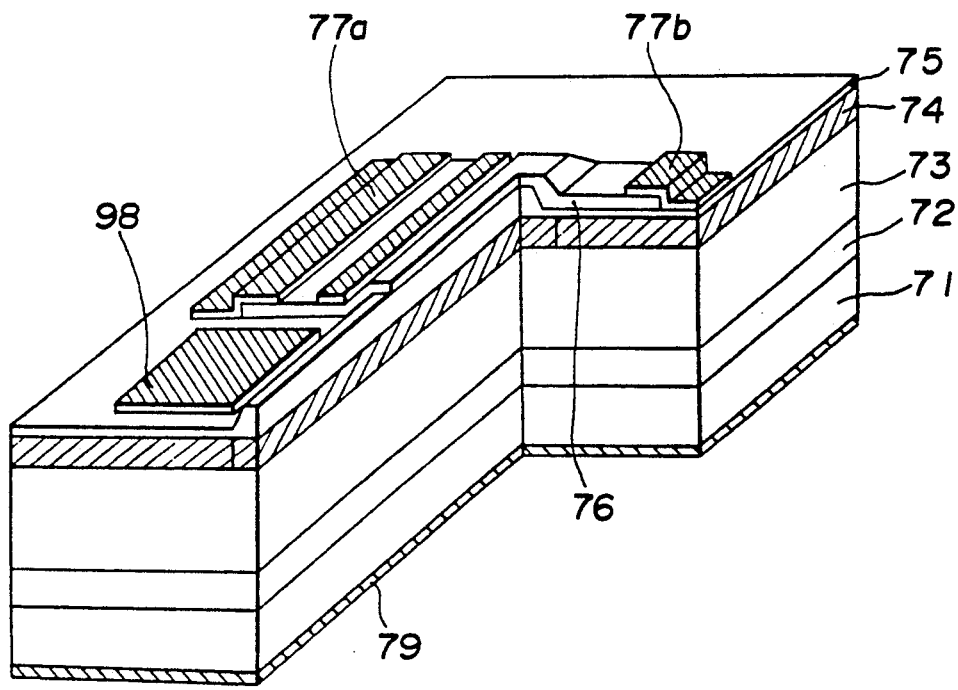
FIG. 12 is a perspective view of a seventh embodiment of a waveguide type photodetector according to the present invention.

FIG. 12 shows a seventh embodiment of a waveguide type photodetector according to the present invention in which a part thereof is cut away.

In FIG. 12, a buffer layer 72 of an n-GaAs layer having a thickness of 0.5 μm, a first clad layer 73 of an n-Al$_{0.5}$Ga$_{0.5}$As layer having a thickness of 1.5 μm, a waveguide layer 74 of a superlattice layer having a thickness of 0.39 μm and consisting of alternately layered $\phi$-Al$_{0.5}$Ga$_{0.5}$As barrier layers (a thickness of 30 Å) and $\phi$-GaAs well layers (a thickness of 60 Å) and a second clad layer 75 of a p-Al$_{0.5}$Ga$_{0.5}$As layer having a thickness of 0.3 μm are successively layered on an n$^+$-GaAs substrate 71. A ridge-type waveguide is then fabricated by etching the second clad layer 75 to a depth of 0.28 μm. After that, an active or light absorbing layer 76 of a $\phi$-GaAs layer having a thickness of 0.2 μm is regrown on the thus fabricated three-dimensional waveguide. For those structures, the MBE method, MO-CVD method and the like may be used as a crystal growth process.

The active layer 76 is then selectively etched by photolithography, and Ti/Pt/Au is deposited to form two Schottky electrodes 77a and 77b. A metal-semiconductor-metal (MSM) detector is thus fabricated. Those electrodes 77a and 77b are made parallel to the extension of the waveguide. Further, Cr/Au is deposited in a region on the second clad layer 75 of p-AlGaAs adjacent to the ridge waveguide as shown in FIG. 12 to form an electrode 78 for sweeping out unwanted carriers.

The operation of the thus fabricated device will be described. A bias voltage is applied between the two electrodes 77a and 77b to create a substantially uniform electric field between the two electrodes 77a and 77b and hence obtain a depletion area therebetween. In this state, when a light having a wavelength of 830 nm from a semiconductor laser is propagated through the waveguide below the active layer 76, the light is propagated while being effectively absorbed into the active layer 76. Thus, carriers are generated in the active layer 76 and drifted towards the electrodes 77a 77b to be detected as a photocurrent. On the other hand, unwanted carriers generated by the light absorbed in other regions than the active layer 76 (the clad layers 73 and 75, the buffer layer 72, the waveguide layer 74 and the substrate 71) are likely to adversely affect the time response characteristic and the light-current characteristic of the device, as explained in the above embodiments.

In this embodiment, the electrodes 78 and 79 are respectively formed on the second clad layer 75 and the substrate 71 while the clad layer 75 functions as a carrier-sweeping layer, similar to the sixth embodiment. The unwanted carriers can be thus swept out. As a result, the time response characteristic is improved. Further, since the confinement of carriers in the active layer 76 is improved, the light-current characteristic is also enhanced.

Eighth Embodiment

Figure 13:
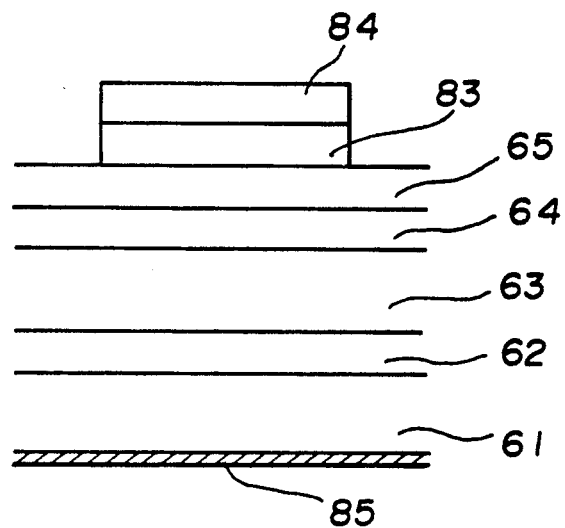
FIG. 13 is a cross-sectional view of an eighth embodiment of a waveguide type photodetector according to the present invention.

FIG. 13 shows an eighth embodiment of the present invention.

In FIG. 13, a buffer layer 62 of an n-GaAs layer having a thickness of 0.5 μm, a first clad layer 63 of an n-Al$_{0.5}$Ga$_{0.5}$As layer having a thickness of 1.5 μm, a waveguide layer 64 of a superlattice layer having a thickness of 0.39 μm and consisting of alternately layered $\phi$-Al$_{0.5}$Ga$_{0.5}$As barrier layers (a thickness of 30 Å) and $\phi$-GaAs well layers (a thickness of 60 Å) and a second clad layer 65 of a p-Al$_{0.5}$Ga$_{0.5}$As layer having a thickness of 0.3 μm are successively layered on an n$^+$-GaAs substrate 61, similarly to the seventh embodiment. A ridge-type waveguide is then fabricated by etching the second clad layer 65 similarly to the seventh embodiment, and at the same time a p$^+$-GaAs contact layer 83 for a carrier-sweeping electrode 84 is formed as shown in FIG. 13. Succeeding processes are the same as those of the seventh embodiment. FIG. 13 is a cross-sectional view at the carrier-sweeping electrode 84.

In this embodiment, since the contact layer 83 for the carrier-sweeping electrode 84 is formed to enhance an ohmic contact between the electrode 84 and the second clad layer 65, the carriers can be effectively swept out at high speed. The characteristics of the seventh embodiment are thereby further improved.

Ninth Embodiment

Figure 14:
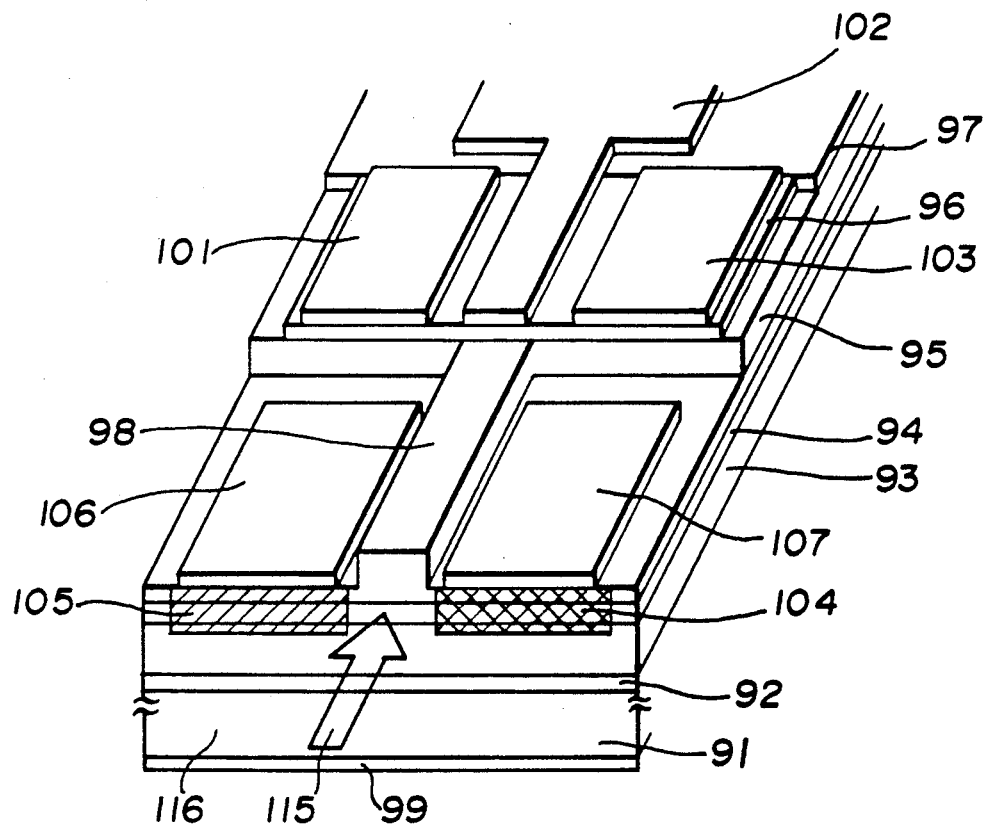
FIG. 14 is a perspective view of a ninth embodiment of a waveguide type photodetector according to the present invention.

FIG. 14 shows a ninth embodiment of a waveguide type photodetector according to the present invention.

In FIG. 14, a buffer layer 92 of a $\phi$-GaAs layer having a thickness of 0.5 μm, a first clad layer 93 of a $\phi$-Al$_{0.5}$Ga$_{0.5}$As layer having a thickness of 1.5 μm, a waveguide layer 94 of a superlattice layer having a thickness of 0.39 μm and consisting of alternately layered $\phi$-Al$_{0.5}$Ga$_{0.5}$As barrier layers (a thickness of 30 Å) and $\phi$-GaAs well layers (a thickness of 60 Å) and a second clad layer 95 of a $\phi$-Al$_{0.5}$Ga$_{0.5}$As layer having a thickness of 0.3 μm are successively layered on a semi-insulating GaAs substrate 91. The waveguide layer 94 may be a layer of AlGaAs whose Al mole fraction is larger than that of the clad layers 93 and 95 or a layer in which the Al mole fraction is varied so that its refractive index is gradually changed in a graded-index manner or the like, not limited to the superlattice layer.

The fabrication of a ridge type waveguide structure 98 for performing a confinement in a lateral direction is conducted in the following manner:

(1) A patterning of a waveguide is performed on the wafer by conventional photolithography.

(2) The second clad layer 95 of φ-Al$_{0.5}$Ga$_{0.5}$As is etched to a depth of 0.28 μm by the RIBE using a Cl$_2$ gas to form the waveguide 98.

(3) A resist mask is removed and a surface is thoroughly cleaned.

An active layer 96 of an n-GaAs layer having a thickness of 0.2 μm and doped with Si of a concentration of $1.0 \times 10^{17}$ cm$^{-3}$ is then selectively regrown on the thus fabricated three-dimensional waveguide. For those structures, the MBE method, MO-CVD method and the like may be used as a crystal growth process.

A light receiving portion is then produced. Since the light receiving portion has an FET structure, source and drain electrodes 101 and 103 which function as ohmic electrodes for detecting carriers by absorbed light are formed with Au-Ge/Ni/Au and a gate electrode 102 which functions as a Schottky electrode is formed by an Al deposition. As to sizes of the device, the gate length is 4 μm, the gate width is 100 μm, the distance between the source 101 and the drain 103 is 1 μm and the distance between the gate 102 and the drain 103 is 4 μm.

The device processing of the light receiving portion is performed in the following manner:

(1) The n-GaAs of the active layer 96 is selectively etched by photolithography. The selective etching process is a dry etching in which only GaAs is selectively etched by the RIE method using a CCl$_2$F$_2$ gas.

(2) Impurity-diffused layers 104 and 105 are produced for depositing thereon carrier-sweeping electrodes 106 and 107.

Figure 15:
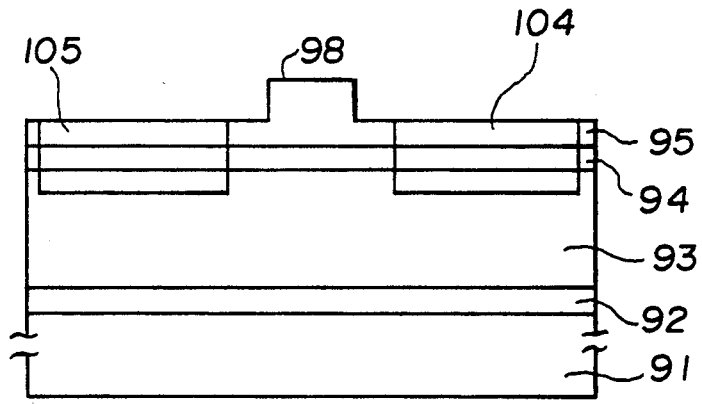
FIG. 15 is a cross-sectional view of the ninth embodiment according to the present invention.

Here, silicon is used as an n-type impurity and zinc is used as a p-type impurity. Diffusion areas are located at both sides of the waveguide 98 as shown in FIG. 15. The process is as follows:

(a) Silicon (a thickness of 500 Å) is deposited over the entire wafer in which the waveguide 98 is fabricated as shown in FIG. 15.

(b) Unnecessary silicon is removed by photolithography.

(c) A protection layer (silicon oxide) is deposited over the entire wafer.

(d) The wafer is heated to 800° C. in a heating furnace to diffuse the silicon.

(e) After cooled, the silicon oxide and silicon are removed.

(f) Silicon oxide is deposited over the entire wafer.

(g) A window is opened only at a needed portion by the photolithography.

(h) The wafer is sealed with zinc arsenide in a vacuum tube.

(i) They are heated to 600° C. in a heating furnace to diffuse the zinc.

(j) After cooled, the silicon oxide is removed.

The fabrication processing of the waveguide continues.

(3) The sample is heated to 250° C., and silicon oxide is deposited by a sputtering deposition system.

(4) Other portions than the active layer 96 and the carrier-sweeping electrode portion are covered with a resist by photolithography, and etching is conducted using a buffered HF solution (BHF).

(5) A patterning of the source and drain electrodes 101 and 103 and the n-type carrier-sweeping electrode 107 is performed.

(6) The Au-Ge/Ni/Au is continuously deposited.

(7) The Au-Ge/Ni/Au in portions other than the electrode portions 101, 103 and 107 is removed by heating a remover and peeling the resist (lift-off process).

(8) Patterning of a draw-out electrode and the p-type carrier-sweeping electrode 106 is performed.

(9) The Cr/Au is continuously deposited.

(10) The Cr/Au in portions other than the electrode portions is removed by heating a remover and peeling the resist.

(11) An alloying is performed to establish an ohmic contact between the active layer 96 and the electrodes.

(12) A patterning of the gate electrode 102 is conducted.

(13) A material of Al of the gate electrode 102 is deposited.

(14) The Al in portions other than the gate electrode portion 102 is removed by heating a remover and peeling the resist.

(15) The semi-insulating substrate 91 is mechanically lapped to reduce the thickness of the entire device to 100 μm to 150 μm.

(16) The Au-Ge/Au is continuously deposited.

(17) An alloying is performed to improve a contact with the substrate 91.

(18) The device is fixed to a package substrate 99 to establish a contact with the exterior.

Figure 16:
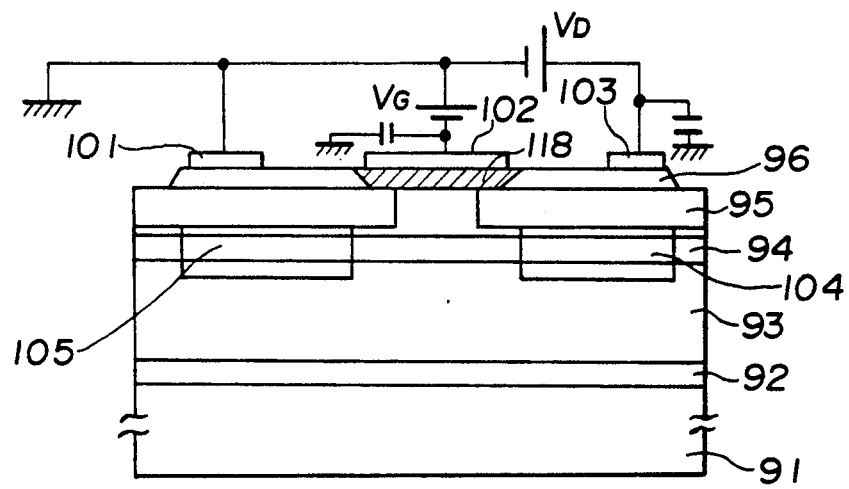
FIG. 16 is a cross-sectional view of the ninth embodiment illustrating a case where an external bias voltage is applied.

The operation of the thus fabricated device will be described referring to FIG. 16. As shown in FIG. 16, a positive voltage $V_G$ relative to the source electrode 101 is applied to the drain electrode 103, and a negative voltage $V_G$ relative to the source electrode 101 is applied to the gate electrode 102. Since this device has a MESFET structure, a depletion layer 118 is caused to extend into the active layer 96 from the gate electrode 102. The width of the depletion layer 118 varies depending on the gate voltage $V_G$, and the width of a channel is changed accordingly. As a result, a drain current $I_D$ flowing between the drain electrode 103 and the source electrode 101 is varied.

When the depletion layer 118 reaches the second clad layer 95, the channel is closed and the drain current $I_D$ ceases to flow.

Figure 18:
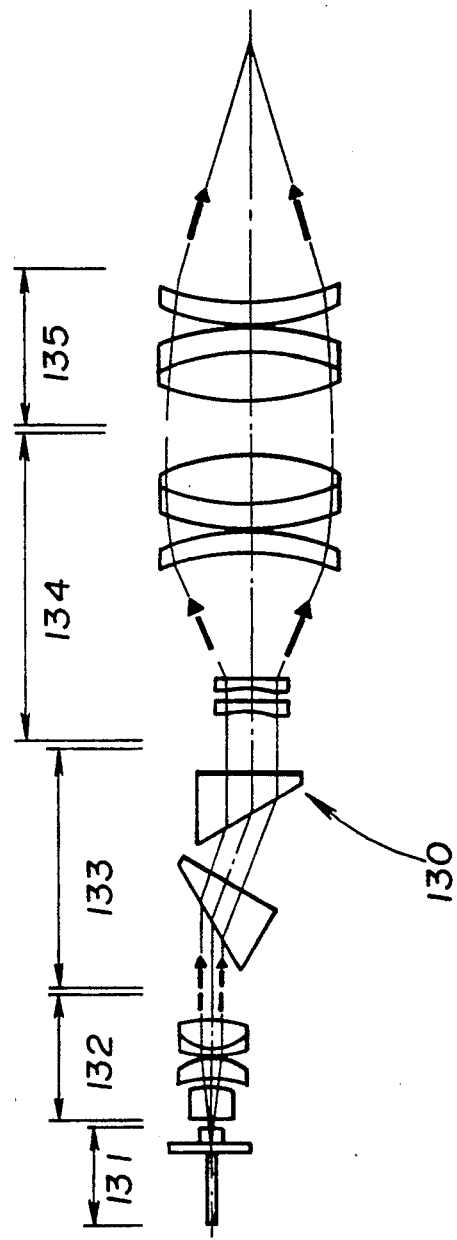
FIG. 18 is a view of an optical system for inputting a light signal into a photodetector of the present invention.

The pinch-off voltage of the gate voltage is known from the $I_D$-$V_D$ characteristic of the fabricated FET structure, and its value in this example is approximately $V_G = -3$ V. A signal light 115 is caused to enter an end surface 116 of this device using an optical system 130 shown in FIG. 18. The wavelength λ of the signal light 115 is λ=830 nm (its photon energy E=1.494 eV), and the signal light 115 is coupled to the waveguide layer 94 by the optical system 130. The optical system 130 includes a laser diode 131, a collimator 132, an anamorphic prism pair 133, a beam expander 134 and a receiver lens 135.

When the FET structure is to be operated as a photodetector, the gate voltage should be set to the pinch-off voltage to improve the response characteristic. In this embodiment, the gate voltage $V_G$ is set to $V_G = -3$ V. Further, the drain voltage $V_D$ is normally set to 1 V to 5 V, and this voltage is set to $V_D = 1.5$ V in this embodiment. A dark current at this time is about 10 nA.

Figure 17:
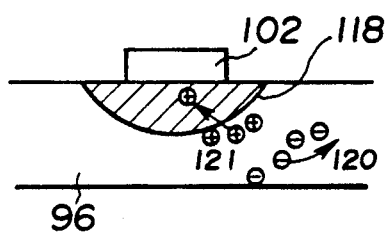
FIG. 17 is a view of the ninth embodiment showing a flow of carriers generated by light absorption.

The signal light 115 input into the end surface 116 shown in FIG. 14 is propagated through the superlattice waveguide layer 94 and reaches a portion between the source 101 and the drain 103 of the FET light receiving portion. As shown in FIG. 17, the signal light 115 at the FET light receiving portion is absorbed in the n-GaAs active layer 96, and electrons 120 and holes 121 are generated. The electrons 120 generated by such absorption arrive at the drain electrode 103 due to the electric field between the gate electrode 102 and the drain electrode 103. The electrons between the gate 102 and the source 101 go towards the drain electrode 103 while diffusing in the depletion layer 118. A current resulting from the electrons 120 is, however, very small, so that it is difficult to measure this current as a photocurrent taken out to the exterior.

The holes 121 diffuse and move to the depletion layer 118 near the gate 102 due to the electric field between the gate 102 and the drain 103, similarly to the electrons 120. The holes in the depletion layer 118 are caused to drift by the electric field and reach the gate electrode 102. As a result, a potential barrier applied to the gate electrode 102 is lowered, and the depletion layer 118 contracts. A channel is present in the active layer 96 of the FET structure solely while the depletion layer 118 is contracted, and hence the electrons move from the source electrode 101 and the drain electrode 103 to cause a flow of drain current. Different from the above-mentioned photocurrent, this drain current has a value determined from the voltage between the source 101 and the drain 103, and therefore, this voltage is determined considering a ratio between the signal light and the dark current.

The holes 121 reaching the gate electrode 102 are drawn out into an external circuit and are recombined in a capacitor in the external circuit. The holes are thus extinguished. At the same time the potential barrier applied to the gate 102 is returned to an original state before the input of the signal light. As a result, the depletion layer 118 extends to close the channel in the active layer 96, and the drain current ceases to flow.

Figure 19:
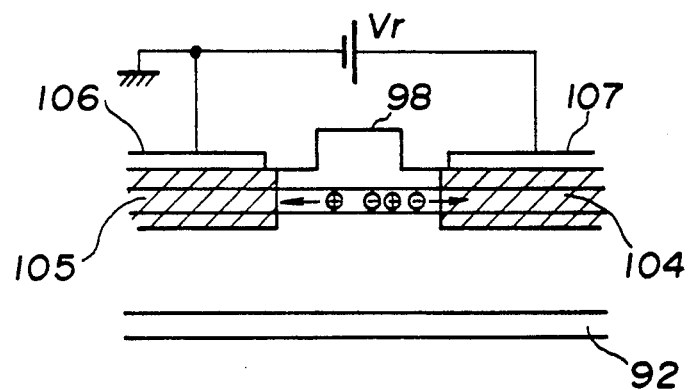
FIG. 19 is a view of the ninth embodiment illustrating a flow of unwanted carriers when a reverse bias voltage is applied between electrodes formed on p and n-type impurity diffusion layers.

On the other hand, carriers generated by the light absorbed in regions (the clad layers 93 and 95, the buffer layer 92 and especially the waveguide layer 94) other than the active layer 96 are likely to be stored in those other regions since almost no electric field only exists in those other regions. Those stored unwanted carriers will disappear after a recombination time (several nanoseconds) elapses. However, some carriers flow into the active layer 96 within the recombination time, and they may cause the degradation of the response characteristic of the photodetector and an unwanted electric field. In this embodiment, the impurity-diffused layers 104 and 105 for sweeping out unwanted carriers are formed in the clad layers 93 and 95 on both sides of the ridge waveguide 98 and the ohmic electrodes 106 and 107 are formed thereon. A reverse voltage $V_r$ is applied as shown in FIG. 19. The unwanted carriers generated in the regions other than the active layer 96 can be thus swept out to the outside. Therefore, the time response characteristic is improved, and the light-current characteristic is also enhanced since no unwanted electric field is generated by the unwanted carriers. Hence the confinement of carriers in the active layer 96 is improved. In this embodiment, no special layers such as a p+-GaAs layer is needed for forming the carrier-sweeping electrodes 106 and 107 so that the positions of the electrodes 106 and 107 can be selected relatively freely.

Tenth Embodiment

In the ninth embodiment, the thermal diffusion of impurities is utilized to form the carrier-sweeping layers, but in this embodiment, the impurity-diffused layers 104 and 105 shown in FIG. 14 are formed by launching p and n-impurities therein, respectively. This is performed by an ion injection system.

Injection conditions are as follows:
(1) An injection depth is set to approximately 0.3 μm at its peak position since the injection is conducted from the level of the bottom of the ridge waveguide 98.
(2) A carrier concentration is set to approximately $1 \times 10^{18} cm^{-3}$.
(3) The p-type impurity is zinc. Beryllium, magnesium and germanium may also be used. The n-type impurity is silicon. Tellurium or the like may also be used.

After the respective ions are injected separately, they are activated by an en-bloc annealing process at an activation temperature from 600° C. to 700° C. A large concentration of the impurities can be readily obtained by such a formation of the impurity-diffused layers 104 and 105. Further, the fabrication of the device is facilitated because neither severe time control nor a sealing process is needed as in the thermal diffusion process. The operation is substantially the same as that of the ninth embodiment.

Eleventh Embodiment

Figure 20:
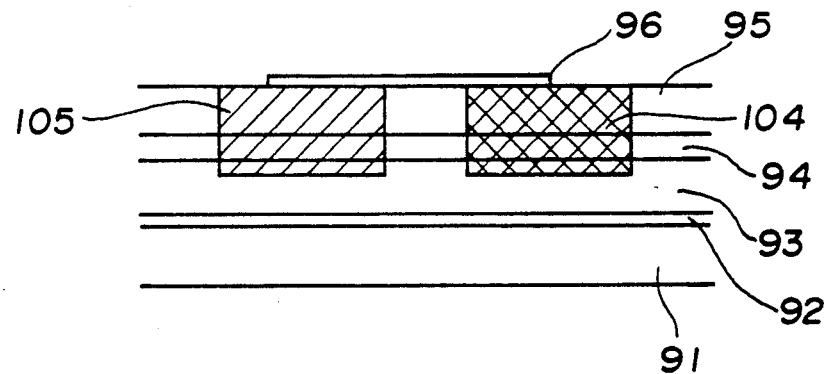
FIG. 20 is a cross-sectional view of an eleventh embodiment of a waveguide type photodetector according to the present invention.

FIG. 20 shows an eleventh embodiment. In the ninth embodiment, the confinement of the input signal light in a lateral direction is performed by the ridge waveguide structure formed as a three-dimensional waveguide structure. In a case of the ridge waveguide structure, however, the width and depth of the ridge are critical in order to strictly control a propagation mode of the propagated light, and particularly the ridge depth should be accurately controlled for the control of a lateral mode.

In this embodiment, the waveguide layer 94 has a superlattice structure, and the p and n-impurities are respectively diffused below the wafer surface. As a result, the carrier-sweeping areas 104 and 105 are formed while making the three-dimensional structure of the waveguide by utilizing the disorganization of the superlattice structure 94 at the time of the impurity diffusion. In this process, after the active layer 96 is dry-etched similarly to the ninth embodiment, the p and n-impurities are respectively diffused below the surface of the second clad layer 95. The distance between the p and n-regions 104 and 105 to be established after the impurity diffusion need only to be set to a value that satisfies a single mode condition of the propagated light (e.g., λ=830 nm and the distance or width is 4 μm). Further, the depth of diffusion is acceptable only if the diffusion front reaches the depth below the waveguide layer 94. Finally, the ohmic electrodes 107 and 106 are respectively formed on the p and n-diffused layers 104 and 105 similarly to the ninth embodiment. Thus, surplus carriers generated in the waveguide layer 94 can be swept out to the outside by applying a reverse voltage as shown in FIG. 19.

Therefore, the time response characteristic is improved, and the light-current characteristic is also enhanced because no unwanted electric field is generated by the surplus carriers. Further, the superlattice structure 94 is disorganized by the impurity diffusion, and its energy gap is made equal to the semiconductor gap of a bulk structure. As a result, the refractive index in that disorganized area is decreased and hence the confinement in the lateral direction is improved.

Twelfth Embodiment

Figure 21:
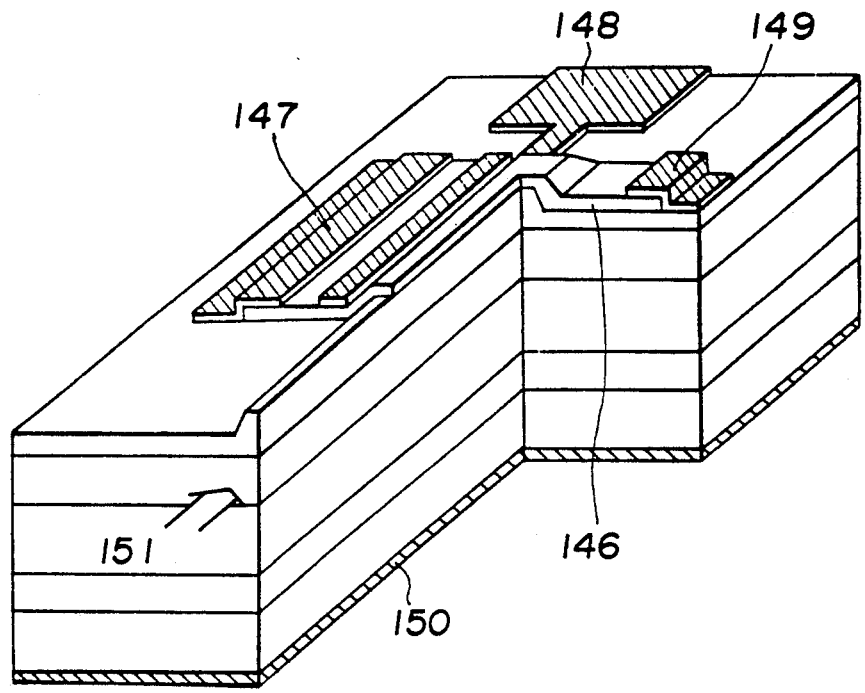
FIG. 21 is a perspective view of a twelfth embodiment of a waveguide type photodetector according to the present invention.

FIG. 21 shows a twelfth embodiment of a waveguide type photodetector according to the present invention.

In FIG. 21, a buffer layer 142 of a p-GaAs layer having a thickness of 0.5 μm, a first clad layer 143 of a φ-Al$_x$Ga$_{1-x}$As layer having a thickness of 1.5 μm, a waveguide layer 144 of a φ-Al$_y$Ga$_{1-y}$As having a thickness of 0.4 μm and a second clad layer 145 of a φ-Al$_z$Ga$_{1-z}$As layer having a thickness of 0.3 μm are successively layered on a p-GaAs substrate 141. Here, the Al mole fraction x is gradually changed from 0 to 0.5 viewed from the substrate side, the Al mole fraction y is 3 at its center and is changed in a parabolic function manner with its both ends being 0.3 and the Al mole fraction z is gradually changed from 0.5 to 0 viewed from the substrate side. In this structure, the band gap becomes narrower towards both outsides of the wafer, so that holes can be readily swept out.

The fabrication of a ridge type waveguide structure for a confinement in a lateral direction is conducted in the following manner:

(1) A patterning of a waveguide is performed on the wafer by conventional photolithography.

(2) The second clad layer 145 of φ-Al$_z$Ga$_{1-z}$As is etched to a depth of 0.28 μm to form the waveguide. The ridge waveguide can be formed not only by etching the second clad layer 145 (a loading type) but by etching the waveguide layer 144 of φ-Al$_y$Ga$_{1-y}$As.

An n-GaAs layer 146 having a thickness of 0.2 μm and doped with Si of a concentration of $1.0 \times 10^{17}$ cm$^{-3}$ is then selectively regrown on the thus fabricated three-dimensional waveguide. For those structures, the MBE method, MO-CVD method and the like may be used as a crystal growth process.

A light receiving portion is then produced. Since the light receiving portion has an FET structure, source and drain electrodes 147 and 149 which functions as ohmic electrodes for detecting a photocurrent are formed with Au-Ge/Ni/Au and a gate electrode 148 which functions as a Schottky electrode is formed by an Al deposition. As to sizes of the device, the gate length is from 1 μm to 4 μm, the gate width is 100 μm, the distance between the source 147 and the drain 149 is 1 μm and the distance between the gate 148 and the drain 149 is 4 μm.

After the entire thickness of the wafer is reduced to 100 μm to 150 μm by lapping the substrate 141, Cr/Au is deposited on the bottom surface of the substrate 141 and an ohmic contact is established therebetween.

Figure 22:
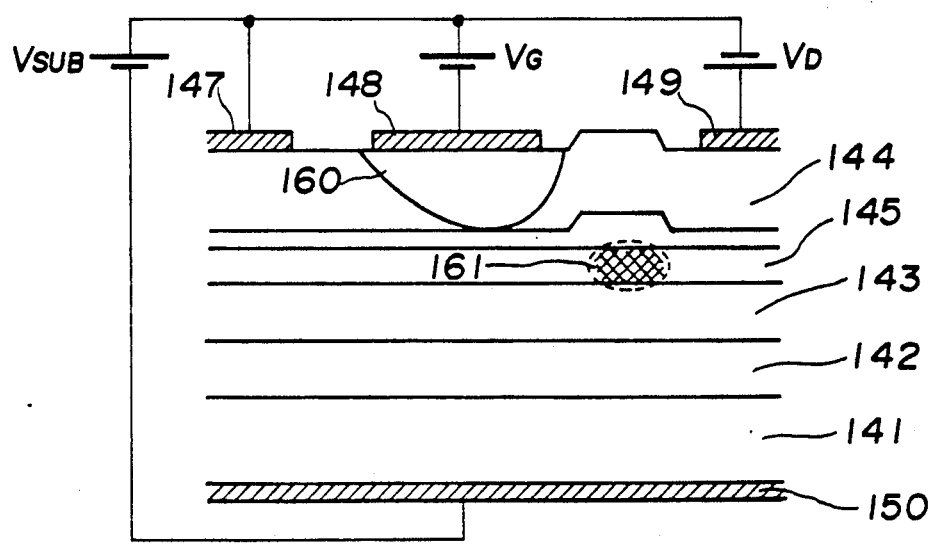
FIG. 22 is a cross-sectional view of the twelfth embodiment according to the present invention.

The operation of the thus fabricated device will be described referring to FIG. 22. As shown in FIG. 22, a positive voltage $V_D$ relative to the source electrode 147 is applied to the drain electrode 149, and a negative voltage $V_G$ relative to the source electrode 147 is applied to the gate electrode 148. Since the gate electrode 148 is a Schottky electrode, a depletion layer 160 is caused to extend into the active layer 146 from the gate electrode 148. The width of the depletion layer 160 varies depending on the gate voltage $V_G$, and the width of a channel is changed accordingly. As a result, a drain current $I_D$ flowing between the drain electrode 149 and the source electrode 147 is varied. When the depletion layer 160 reaches the second clad layer 145, the channel is closed and the drain current $I_D$ ceases to flow.

In this state, when a light (its wavelength is about 830 nm) from a semiconductor laser is caused to enter a waveguide 161 under the active layer 146, the light is propagated while being absorbed into the active layer 146 and carriers are generated therein. As a result, the potential near the channel is varied, and a current flows between the source 147 and the drain 149.

On the other hand, hole carriers generated by a light absorbed in regions (the clad layers 143 and 145, the buffer layer 142, the waveguide layer 144 and the substrate 141) other than the active layer 146 are diffused and stored since the mobility thereof is slower than that of the electron by about one order and almost no electric field only exists in those other regions. As a result, the time response characteristic of the device is likely to be degraded. Further, the stored holes are likely to cause an electric field, and this electric field is likely to degrade the confinement of carriers in the active layer 146. Accordingly, the light-current characteristic is rendered unstable and at the same time the sensitivity of the photodetector is lowered.

In this embodiment, the conductivity type of the substrate 141 is made p-type, the electrode 150 is formed on the substrate 141 and a bias voltage $V_{SUB}$ is applied as shown in FIG. 22. Holes generated in the other regions than the active layer 146 are thus swept out through the substrate 141. In addition, the Al mole fraction of the AlGaAs layers is gradually changed so that the stagnation of carriers at hetero-boundaries can be prevented and they can be effectively swept out. Therefore, the time response characteristic is improved. Further, electrostatic potentials of respective portions in the photodetector are made stable since the electric field due to the unwanted carriers ceases. Thus, the light-current characteristic becomes stable and the sensitivity is improved.

Thirteenth Embodiment

Figure 23:
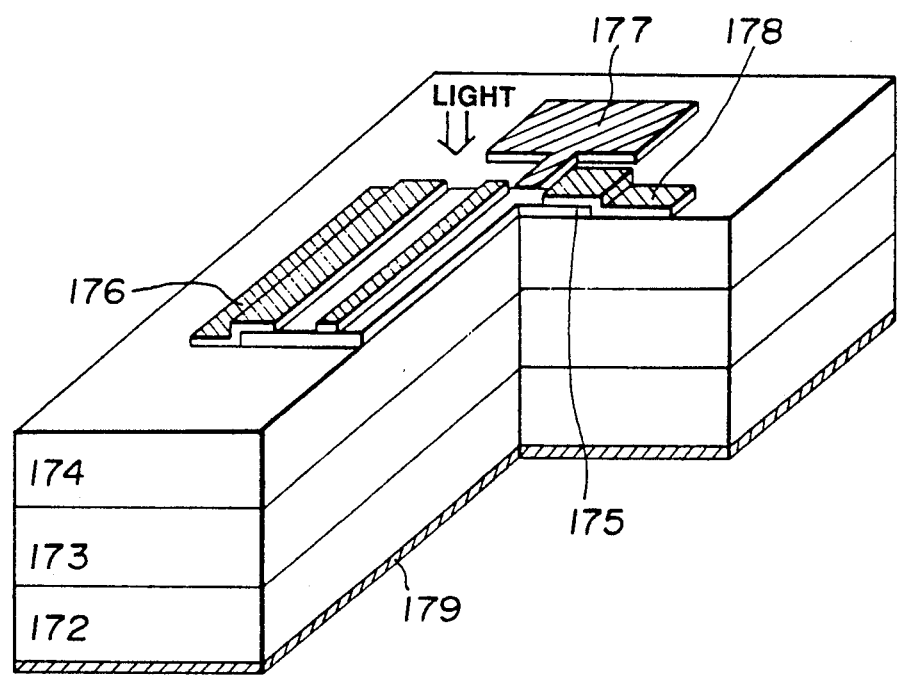
FIG. 23 is a perspective view of a thirteenth embodiment of a vertical incidence type photodetector according to the present invention.

FIG. 23 shows a thirteenth embodiment according to the present invention.

In FIG. 23, a first buffer layer 173 of a p-GaAs layer having a thickness of 1.5 μm, a second buffer layer 174 of a p-Al$_x$Ga$_{1-x}$As layer having a thickness of 1.5 μm are successively layered on a p-GaAs substrate 172. Here, the Al mole fraction x is gradually changed from 0 to 0.5 within 1.5 μm from the substrate side, the Al mole fraction x is equal to 0.5 from 0.5 μm to 1.0 μm from the substrate side and the Al mole fraction x is gradually changed from 0.5 to 0 from 1.0 μm to 1.5 μm from the substrate side. In this structure, the band gap becomes narrower towards both outer sides of the wafer, so that holes can be readily swept out. An n-GaAs layer 175 having a thickness of 0.2 μm and doped with Si of a concentration of $1.0 \times 10^{17}$ cm$^{-3}$ is then layered on the second buffer layer 174.

A light receiving portion is then produced in the same manner as that of the twelfth embodiment. Namely, a source electrode 176, a drain electrode 178, a gate electrode 177 and a bottom electrode 179 are formed respectively.

Figure 24:
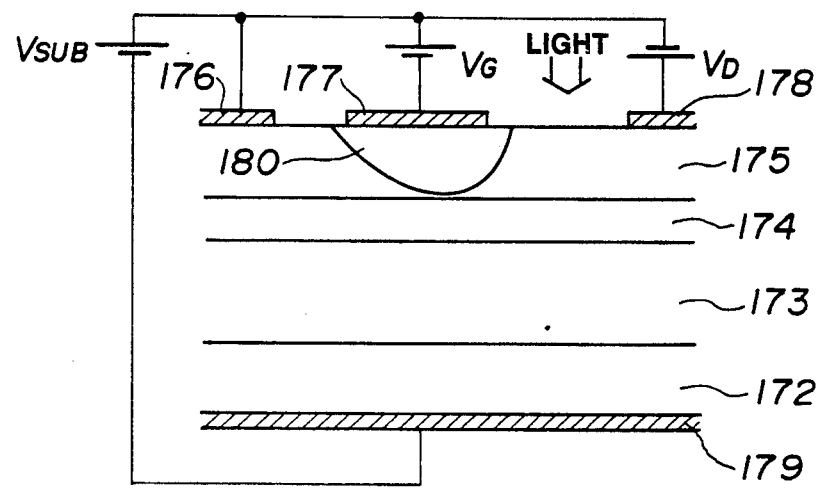
FIG. 24 is a cross-sectional view of the thirteenth embodiment according to the present invention.

The operation of the thus fabricated device will be described referring to FIG. 24. As shown in FIG. 24, a positive voltage $V_D$ relative to the source electrode 176 is applied to the drain electrode 178, and a negative voltage $V_G$ relative to the source electrode 176 is applied to the gate electrode 177. Thus, the pinch-off state is established, similarly to the twelfth embodiment.

In this state, when a light (its wavelength is 830 nm) from a semiconductor laser is applied to the gate electrode 177 and to an area between the gate 177 and the drain 178 from above the device, the illuminated light is absorbed in the active layer 175 and carriers are generated thereat. As a result, a potential near a channel 180 is varied, and a current flows between the source 176 and the drain 178.

On the other hand, similar to the twelfth embodiment, the light is absorbed in regions other than the active layer 175 and carriers are also generated in these regions. Those surplus carriers, especially holes, are likely to degrade the time response and light-current characteristics.

In this embodiment, the conductivity type of the substrate 172 is made p-type, the electrode 179 is formed on the substrate 172 and a bias voltage $V_{SUB}$ is applied as shown in FIG. 24. Holes generated in regions other than the active layer 175 are thus swept out through the substrate 172. In addition, the Al mole fraction of the AlGaAs layer is gradually changed so that the stagnation of carriers at hetero-boundaries can be prevented and that they can be effectively swept out. Therefore, the time response characteristic and the sensitivity of the photodetector are improved, similarly to the twelfth embodiment.

Fourteenth Embodiment

Figure 25:
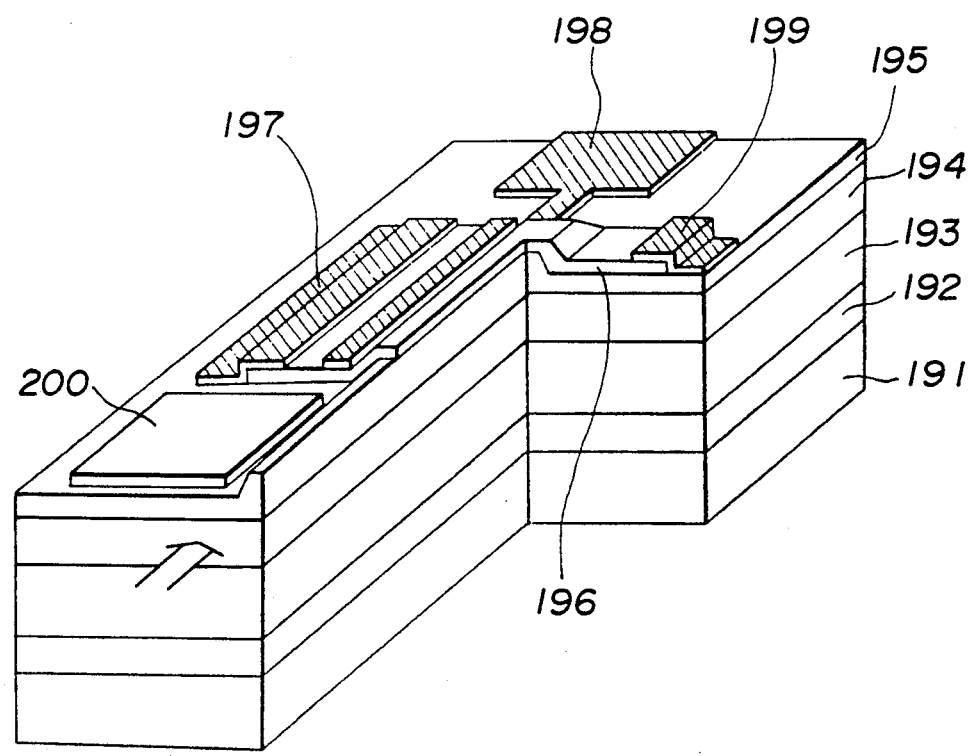
FIG. 25 is a perspective view of a fourteenth embodiment of a waveguide type photodetector according to the present invention.

FIG. 25 shows a fourteenth embodiment of a waveguide type photodetector according to the present invention.

In FIG. 25, a buffer layer 192 of a $\phi$-GaAs layer having a thickness of 0.5 $\mu$m, a first clad layer 193 of a $\phi$-Al$_x$Ga$_{1-x}$As layer having a thickness of 1.5 $\mu$m, a waveguide layer 194 of a $\phi$-Al$_y$Ga$_{1-y}$As having a thickness of 0.4 $\mu$m and a second clad layer 195 of a $\phi$-Al$_z$Ga$_{1-z}$As layer having a thickness of 0.3 $\mu$m are successively layered on a semi-insulating GaAs substrate 191. Here, the Al mole fraction x is gradually changed from 0 to 0.5 viewed from the substrate side, the Al mole fraction y is 0.3 at its center and is changed in a parabolic manner with its both ends being 0.5 and the Al mole fraction z is gradually changed from 0.5 to 0 viewed from the substrate side. In this structure, the band gap becomes narrower towards both outer sides of the wafer, so that unwanted holes can be readily swept out.

The fabrication of a ridge type waveguide structure for performing a confinement in a lateral direction is conducted in the same manner as that of the twelfth embodiment. An n-GaAs layer 196 doped with Si of a concentration of $1.0 \times 10^{17}$cm$^{-3}$ is then selectively regrown on the thus fabricated three-dimensional waveguide. For those structures, the MBE method, MOCVD method and the like may be used as a crystal growth process.

A light receiving portion is then produced. Since the light receiving portion has an FET structure, source 197 and drain electrodes 197 and 199 which function as ohmic electrodes for detecting a photocurrent are formed with Au-Ge/Ni/Au and a gate electrode 198 which functions as a Schottky electrode is formed by an Al deposition. Further, a carrier-sweeping electrode 200 is deposited on an area of the p-type clad layer 195 adjacent to the ridge waveguide, as shown in FIG. 25.

Similarly to the twelfth embodiment, a positive voltage $V_D$ relative to the source electrode 197 is applied to the drain electrode 199, and a negative voltage $V_G$ relative to the source electrode 197 is applied to the gate electrode 198. The pinch-off state is thus established. Further, a negative voltage relative to the source electrode 197 is applied to the carrier-sweeping electrode 200.

In this state, when a light (its wavelength is 830 nm) from a semiconductor laser is propagated through the waveguide, the light is propagated while being absorbed in the active layer 196 and carriers are generated thereat. The light is thus detected similarly to the twelfth embodiment. In this embodiment, the conductivity type of the second clad layer 195 adjacent to the active layer 196 is made p-type, and the electrode 200 is formed on the second clad layer 195. Holes generated in regions other than the active layer 196 are thus swept out through the electrode 200. In addition, the Al mole fraction of the AlGaAs layers is gradually changed so that the stagnation of carriers at hetero-boundaries can be prevented and that they can be effectively swept out. Therefore, the time response characteristic and the sensitivity of the photodetector are improved as described with reference to the twelfth embodiment.

Fifteenth Embodiment

Figure 26:
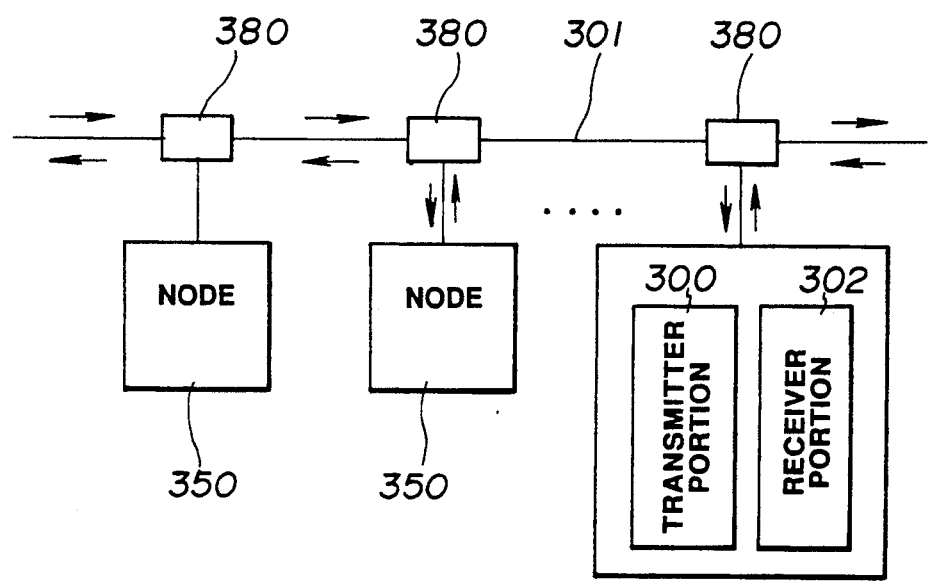
FIG. 26 is a view of a bus type LAN system in which a photodetector according to the present invention is used to receive a light signal.

FIG. 26 shows a bus type optical local area network (LAN) in which the photodetector of the present invention is used. This system includes nodes 350 each having a transmitter portion 300 and a receiver portion 302, and a light transmission line 301.

The transmitter portion 300 contains a light source such as a semiconductor laser, a light modulation circuit and so forth as is well known in the art. The receiver portion 302 contains a photodetector, an amplifier, a filter, a signal processor and so forth. The photodetector in the receiver portion 302 is that of the present invention.

A light signal transmitted from the transmitter portion 300 in one node 350 is received by the receiver portion 302 in another node 350 through a coupler 380 connected to the transmitting node 350, the optical transmission line 301 and the coupler 380 connected to the receiving node 350. The signal is detected by the photodetector of the present invention in the receiving node 350 and is processed by other electronic circuits such as the amplifier, the filter and the signal processor to be converted to an output signal.

As an access control system, carrier sense multiple access (CSMA)/collision detection (CD), token passing system or the like can be utilized. A high-speed optical communication can be attained by using the photodetector of the present invention in the system. The photodetector of the present invention can, of course, be used in any type of an optical communication system (such as a loop type and a star type).

Following technical advantages can be obtained by a photodetector and an optical communication system according to the present invention:

(1) Time delay due to the stored unwanted carriers, especially holes, is eliminated by the sweep-out of the unwanted carriers, and the time response characteristic is improved.

(2) Electrostatic potentials at respective portions of the photodetector are stabilized since no electric field is generated by the stored unwanted carriers, especially holes, and the light-current characteristic is hence rendered stable.

(3) The light-current characteristic is improved since the confinement of carriers in the active or light absorbing layer is enhanced.

(4) Circuit integration becomes easy since a photodetector can be readily fabricated as an FET type structure so that a pre-amplifier can be fabricated together with the fabrication of the photodetector.

(5) A good S/N ratio and a better time response can be obtained since a photodetector can be readily integrated with a pre-amplifier.

(6) An optical communication or LAN system can have high bit-rate communication since a photodetector used therein can have a high-speed response time.

Further, the following technical advantages can also be obtained by a photodetector in which the p-type impurity diffusion layer with the ohmic electrode thereon and then-type impurity diffusion layer with the ohmic electrode thereon are respectively located at both sides of a propagation waveguide of the photodetector:

(1) Carriers (electrons and holes) generated in other regions than the active layer can be swept out by applying a reverse bias voltage between the ohmic electrodes. As a result, the degradation of time response of the photodetector due to the diffusion of holes into the active layer can be prevented, and at the same time the increase of a dark current due to the diffusion of electrons can be prevented. Therefore, the S/N ratio is also improved.

(2) In a case where a waveguide is formed by disorganizing a superlattice structure by the p and n-impurity diffusion layers, the refractive index of the disorganized portions is lowered. As a result, the confinement of a propagated light in a lateral direction is improved.

Further, following technical advantages can also be obtained by a photodetector in which the Al mole fraction is gradually varied:

(1) Holes can be speedily and positively swept out by the structure wherein the Al mole fraction of the clad layer, the waveguide layer or the like is gradually changed. As a result, the time delay due to the holes is eliminated and the time response characteristic is further improved.

(2) No holes are stored at the hetero-boundary, so that no unwanted electric field is generated whatever. As a result, electrostatic potentials at respective portions are stabilized, and the light-current characteristic is rendered stable.

While the present invention has been described with respect to what is presently considered to be the preferred embodiment, it is understood that the invention is not limited to the disclosed embodiments. The present invention is intended to cover various modifications and equivalent arrangements included within the spirit and scope of the appended claims.

What is claimed is:

1. A photodetector comprising:
   light guiding means for guiding a light;
   light detecting means for receiving and detecting the light guided by said light guiding means, said light detecting means including a light absorbing layer for absorbing the light to generate carriers; and
   carrier-sweeping means for sweeping out carriers generated in regions other than said light absorbing layer.

2. A photodetector according to claim 1, wherein said light guiding means comprises a light waveguide monolithically integrated with said light detecting means.

3. A photodetector according to claim 2, wherein said carrier-sweeping means is disposed at a lateral side of said light waveguide.

4. A photodetector according to claim 2, wherein said carrier-sweeping means is disposed on an extended line of said light waveguide in a light propagation direction.

5. A photodetector according to claim 1, wherein said carrier-sweeping means comprises hole-sweeping means for sweeping out holes generated in said regions other than said light absorbing layer.

6. A photodetector according to claim 5, further comprising a p-type substrate and a p-type buffer layer formed on a top surface of said substrate and wherein said light detecting means is formed on said substrate and said buffer layer and said hole-sweeping means comprises an ohmic electrode formed on a bottom surface of said substrate.

7. A photodetector according to claim 5, wherein said light detecting means comprises a p-type layer formed adjacent to said light absorbing layer and said hole-sweeping means comprises a hole-sweeping electrode formed on said p-type layer.

8. A photodetector according to claim 1, wherein said carrier-sweeping means comprises a carrier-sweeping layer and a carrier-sweeping electrode formed on said carrier-sweeping layer.

9. A photodetector according to claim 8, wherein said carrier-sweeping layer comprises a semiconductor material, a conductivity type of said semiconductor material being different from that of said light absorbing layer.

10. A photodetector according to claim 8, wherein said carrier-sweeping electrode comprises an ohmic electrode.

11. A photodetector according to claim 1, further comprising an n-type substrate and an n-type buffer layer formed on a top surface of said substrate and wherein said light detecting means is formed on said substrate and said buffer layer and said carrier-sweeping means comprises an ohmic electrode formed on a bottom surface of said substrate.

12. A photodetector according to claim 1, wherein said light detecting means comprises a field effect transistor structure.

13. A photodetector according to claim 1, wherein said carrier-sweeping means comprises a conductive impurity-diffused layer formed in the vicinity of said light absorbing layer and an electrode formed on said conductive impurity-diffused layer.

14. A photodetector according to claim 13, wherein said conductive impurity-diffused layer comprises a p-type impurity-diffused layer and an n-type impurity-diffused layer.

15. A photodetector according to claim 14, wherein said p-type impurity-diffused layer is formed by a thermal diffusion using one of zinc and zinc oxide.

16. A photodetector according to claim 14, wherein said n-type impurity-diffused layer is formed by a thermal diffusion using silicon.

17. A photodetector according to claim 13, wherein said impurity-diffused layer is formed by a thermal diffusion.

18. A photodetector according to claim 14, wherein said p-type impurity-diffused layer is formed by an ion injection using one of zinc, magnesium and germanium.

19. A photodetector according to claim 14, wherein said n-type impurity-diffused layer is formed by an ion injection using one of silicon and tellurium.

20. A photodetector according to claim 13, wherein said impurity-diffused layer is formed by an ion injection.

21. A photodetector according to claim 13, wherein said electrode formed on said impurity-diffused layer comprises an ohmic electrode.

22. A photodetector according to claim 10, wherein the carriers generated in said regions other than said light absorbing layer are swept out by applying a reverse bias voltage to said ohmic electrode.

23. A photodetector according to claim 21, wherein said carriers generated in said regions other than said light absorbing layer are swept out by applying a reverse bias voltage to said ohmic electrode.

24. A photodetector according to claim 17, wherein said light guiding means comprises a light waveguide layer having a superlattice structure and said waveguide layer is formed as a three-dimensional waveguide structure by a disorganization of said superlattice structure performed while said impurity-difused layer is formed.

25. A photodetector according to claim 20, wherein said light guiding means comprises a light waveguide layer having a superlattice structure and said waveguide layer is formed as a three-dimensional waveguide structure by a disorganization of said superlattice structure performed while said impurity-diffused layer is formed.

26. A photodetector according to claim 1, further comprising at least two layers formed in the vicinity of said light absorbing layer, an energy band gap of materials of said at least two layers being continuously changed.

27. A photodetector according to claim 26, wherein said light guiding means comprises a clad layer and a light waveguide layer, an energy band gap of materials of said clad layer and said light waveguide layer being continuously changed symmetrically with said light waveguide layer as a center.

28. A photodetector according to claim 26, wherein said at least two layers comprise a GaAs and an AlGaAs and an energy band gap around a hetero-boundary of said at least two layers being continuously changed by changing an Al mole fraction around said hetero-boundary.

29. A bus type local area network system comprising:
a plurality of nodes each comprising a receiver portion, said receiver portion including a photodetector and said photodetector comprising light guiding means for guiding a light, light detecting means for receiving and detecting the light guided by said guiding means, said light detecting means including a light absorbing layer for absorbing the light to generate carriers, and carrier-sweeping means for sweeping out carriers generated in regions other than said light absorbing layer; and
a light transmission line for connecting said nodes with one another.

30. An optical communication system comprising:
a plurality of nodes each comprising a receiver portion, said receiver portion including a photodetector and said photodetector comprising light guiding means for guiding a light, light detecting means for receiving and detecting the light guided by said guiding means, said light detecting means including a light absorbing layer for absorbing the light to generate carriers, and carrier-sweeping means for sweeping out carriers generated in regions other than said light absorbing layer; and
a light transmission line for connecting said nodes.

31. A method for detecting light in a multilayer photodetector comprising the steps of:
guiding a light in a predetermined layer;
receiving and detecting the guided light in a light absorbing layer to generate carriers; and
sweeping out carriers generated in layers other than the light absorbing layer.

* * * * *

UNITED STATES PATENT AND TRADEMARK OFFICE
CERTIFICATE OF CORRECTION

PATENT NO. : 5,298,739  
DATED : March 29, 1994  
INVENTOR(S) : Tamayo Hiroki et al Page 1 of 2

It is certified that error appears in the above-indentified patent and that said Letters Patent is hereby corrected as shown below:

Title Page:
AT [30] FOREIGN APPLICATION PRIORITY DATA

"Apr. 24, 1992 [JP] Japan .......... 3-140089"
should read
--May 2, 1992 [JP] Japan .......... 3-140089--.

AT [56] REFERENCES CITED

U.S. Patent Documents,
"Hana et al." should read --Hara et al.--.

AT [57] ABSTRACT

Line 8, "carrier sweeping" should read
--carrier-sweeping--.

COLUMN 1

Line 10, "particularly" should read --particularly,--.
Line 22, "a" should read --an--.
Line 67, "leads" should read --lead--.

COLUMN 6

Line 32, "Also" should read --Also,--.

COLUMN 10

Line 47, "$\chi$-$Al_{0.5}Ga_{0.5}As$" should read --$\Phi$-$Al_{0.5}Ga_{0.5}As$--.
Line 48, "$\chi$-GaAs" should read --$\Phi$-GaAs--.

UNITED STATES PATENT AND TRADEMARK OFFICE
CERTIFICATE OF CORRECTION

PATENT NO. : 5,298,739

DATED : March 29, 1994

INVENTOR(S) : Tamayo Hiroki et al

It is certified that error appears in the above-indentified patent and that said Letters Patent is hereby corrected as shown below:

COLUMN 11

Line 68, "77a 77b" should read --77a and 77b--.

COLUMN 15

Line 32, "time" should read --time,--.
Line 62, "107" should read --107,--.

COLUMN 23

Line 24, "impurity-difused" should read --impurity-diffused--.

Signed and Sealed this

Twenty-second Day of November, 1994

BRUCE LEHMAN

Attest:

Attesting Officer

Commissioner of Patents and Trademarks